(12) United States Patent
Zhu

(10) Patent No.: US 10,861,748 B2
(45) Date of Patent: Dec. 8, 2020

(54) SEMICONDUCTOR ARRANGEMENT AND METHOD FOR MANUFACTURING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 15/723,928

(22) Filed: Oct. 3, 2017

(65) Prior Publication Data

US 2018/0033699 A1 Feb. 1, 2018

Related U.S. Application Data

(63) Continuation-in-part of application No. 14/411,073, filed as application No. PCT/CN2014/070713 on Jan. 16, 2014, now Pat. No. 9,780,200.

(30) Foreign Application Priority Data

Nov. 28, 2013 (CN) .......................... 2013 1 0627406

(51) Int. Cl.
*H01L 29/06* (2006.01)
*H01L 29/66* (2006.01)
(Continued)

(52) U.S. Cl.
CPC ............... *H01L 21/823481* (2013.01); *H01L 21/26533* (2013.01); *H01L 21/761* (2013.01);
(Continued)

(58) Field of Classification Search
CPC ................... H01L 21/823481; H01L 29/6681
See application file for complete search history.

(56) References Cited

U.S. PATENT DOCUMENTS

| 8,609,510 B1 * | 12/2013 | Banna ............... H01L 29/66545 438/424 |
| 2007/0134884 A1 * | 6/2007 | Kim ................ H01L 21/823437 438/424 |

(Continued)

FOREIGN PATENT DOCUMENTS

| CN | 102468161 A | 5/2012 |
| CN | 103137624 A | 6/2013 |
| CN | 103219340 A | 7/2013 |

OTHER PUBLICATIONS

International Search Report for PCT/CN2014/070713 (dated Sep. 5, 2014).

(Continued)

*Primary Examiner* — Kenneth Parker
*Assistant Examiner* — Long H Le
(74) *Attorney, Agent, or Firm* — Christensen, Fonder, Dardi & Herbert PLLC

(57) ABSTRACT

Provided are a semiconductor arrangement and a method for manufacturing the same. An example arrangement may comprise: a bulk semiconductor substrate; a fin formed on the substrate; a first FinFET and a second FinFET formed on the substrate, wherein the first FinFET comprises a first gate stack intersecting the fin and a first gate spacer disposed on sidewalls of the first gate stack, the second FinFET comprises a second gate stack intersecting the fin and a second gate spacer disposed on sidewalls of the second gate stack; a dummy gate spacer formed between the first FinFET and the second FinFET and intersecting the fin; a first isolation section self-aligned to a space defined by the dummy gate spacer, wherein the isolation section electrically isolates the (Continued)

first FinFET from the second FinFET; and a second isolation layer disposed under a bottom surface of the first isolation section.

14 Claims, 30 Drawing Sheets

(51) Int. Cl.
| | |
|---|---|
| *H01L 29/78* | (2006.01) |
| *H01L 21/265* | (2006.01) |
| *H01L 21/761* | (2006.01) |
| *H01L 21/762* | (2006.01) |
| *H01L 21/8234* | (2006.01) |
| *H01L 21/8238* | (2006.01) |

(52) U.S. Cl.
CPC ...... *H01L 21/762* (2013.01); *H01L 21/76208* (2013.01); *H01L 21/76224* (2013.01); *H01L 21/76232* (2013.01); *H01L 21/823431* (2013.01); *H01L 21/823468* (2013.01); *H01L 29/0649* (2013.01); *H01L 29/66545* (2013.01); *H01L 29/66795* (2013.01); *H01L 29/785* (2013.01); *H01L 29/7848* (2013.01); *H01L 21/26513* (2013.01); *H01L 21/26586* (2013.01); *H01L 21/823821* (2013.01)

(56) References Cited

U.S. PATENT DOCUMENTS

| | | | |
|---|---|---|---|
| 2008/0237634 A1 | 10/2008 | Dyer et al. | |
| 2014/0239354 A1* | 8/2014 | Huang | H01L 29/0653 257/288 |
| 2014/0256094 A1* | 9/2014 | Lin | H01L 29/66545 438/158 |
| 2014/0353763 A1* | 12/2014 | Chung | H01L 21/823431 257/390 |

OTHER PUBLICATIONS

Written Opinion of the International Searching Authority for PCT/CN2014/070713 (dated Sep. 9, 2014).

* cited by examiner

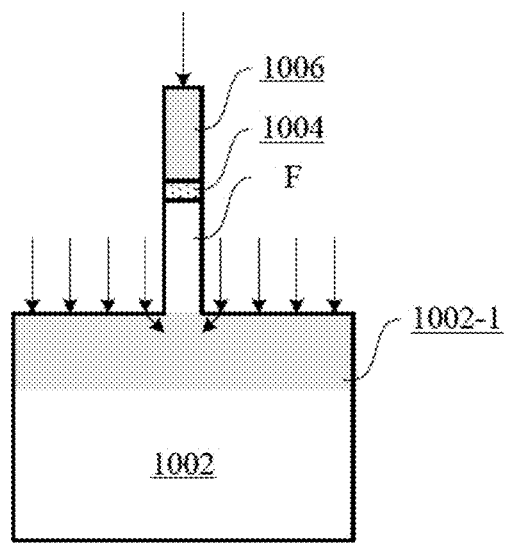
Fig. 3(c)
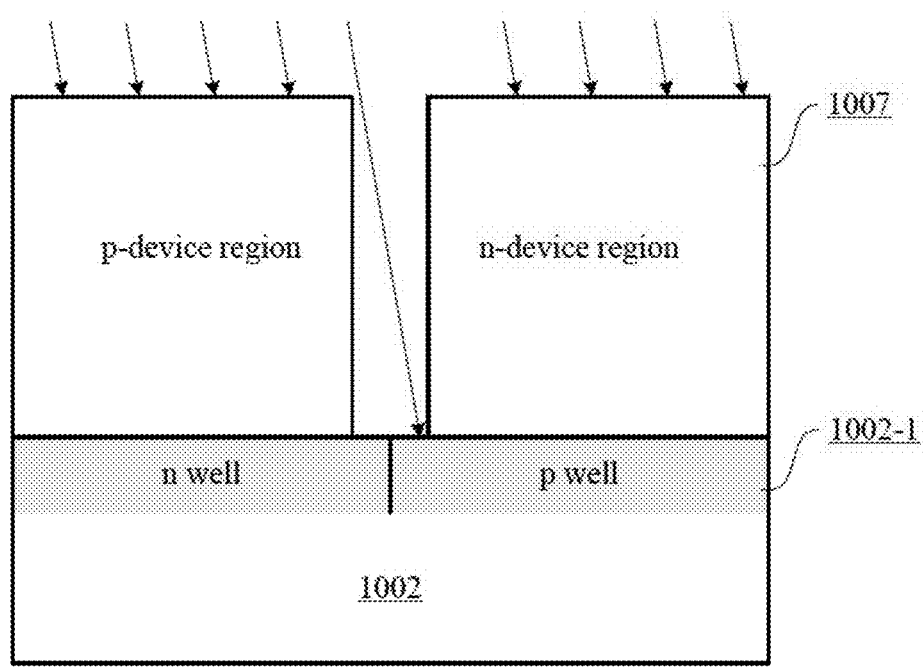
Fig. 3(b')

SEMICONDUCTOR ARRANGEMENT AND METHOD FOR MANUFACTURING THE SAME

CROSS-REFERENCE TO RELATED APPLICATIONS

This application is a continuation-in-part application of U.S. patent application Ser. No. 14/411,073, filed Dec. 23, 2014, which is a national stage entry of PCT/CN2014/070713, filed Jan. 16, 2014, which claims priority to Chinese Patent Application No. 201310627406.8, filed Nov. 28, 2013, all of which are incorporated by reference in their entirety herein.

TECHNICAL FIELD

The present disclosure generally relates to manufacture of Integrated Circuits (Ics), and in particular, to a semiconductor arrangement comprising an isolation section with a reduced area penalty and an enhanced IC performance and a method for manufacturing the same.

BACKGROUND

With increasing demands for multi-functional miniaturized electronic devices, it is expected to integrate more and more devices on a chip for a given area. However, current devices have already been so miniaturized to approach physical limits, and thus it is more and more difficult to further reduce an average area per device. Further, any area penalty may result in increased cost.

One of solutions to follow the trend of miniature is 3D devices, such as, FinFETs (Fin Field Effect Transistors). The FinFETs have reduced footprints on a chip surface by extending in a height direction. However, as compared with planar devices such as MOSFETs, more areas are occupied by isolation between FinFETs because each isolation usually requires two dummy gates.

SUMMARY

In view of the above, the present disclosure proposes a semiconductor arrangement and a method for manufacturing the same to address at least the above problems and/or at least provide the following advantages.

According to an aspect of the present disclosure, a semiconductor arrangement is provided. The semiconductor arrangement comprises: a bulk semiconductor substrate; a fin formed on the substrate; a first FinFET and a second FinFET formed on the substrate, wherein the first FinFET comprises a first gate stack intersecting the fin and a first gate spacer disposed on sidewalls of the first gate stack, the second FinFET comprises a second gate stack intersecting the fin and a second gate spacer disposed on sidewalls of the second gate stack; a dummy gate spacer formed between the first FinFET and the second FinFET and intersecting the fin; a first isolation section self-aligned to a space defined by the dummy gate spacer, wherein the first isolation section electrically isolates the first FinFET from the second FinFET; and a second isolation section disposed under a bottom surface of the first isolation section.

According to further embodiments of the present disclosure, an electronic device comprising an Integrated Circuit (IC) comprising any of the semiconductor arrangements described herein is provided. In one such aspect, the electronic device further comprises a display operatively coupled to the IC and a wireless transceiver operatively coupled to the IC. In another such aspect, the electronic device further comprises a smart phone, a computer, a tablet computer, an artificial intelligence, a wearable smart device, or a mobile power supply.

According to another aspect of the present disclosure, a method of manufacturing a semiconductor arrangement is provided. The method comprises: forming a fin on a bulk semiconductor substrate; forming a first isolation section in a region of the bulk semiconductor substrate at the bottom of the fin, wherein the first isolation section comprises at least one of an insulation layer, a pn junction isolation, or a doped semiconductor isolation; forming a dummy gate structure intersecting the fin in the region on the bulk semiconductor substrate, and also a first gate structure and a second gate structure intersecting the fin on opposite sides of the dummy gate structure; forming a first gate spacer, a second gate spacer, and a dummy gate spacer on sidewalls of the first gate structure, the second gate structure, and the dummy gate structure, respectively; forming a trench self-aligned to a space defined by the dummy gate spacer, wherein the trench extends to the insulation layer; and filling the trench with a dielectric material to form an isolation section.

According to another aspect of the present disclosure, a method of manufacturing a semiconductor arrangement is provided. The method comprises: forming a fin on a bulk semiconductor substrate; forming a dummy gate structure intersecting the fin, and also a first gate structure and a second gate structure intersecting the fin on opposite sides of the dummy gate structure; forming a first gate spacer, a second gate spacer, and a dummy gate spacer on sidewalls of the first gate structure, the second gate structure, and the dummy gate structure, respectively; forming a trench self-aligned to a space defined by the dummy gate spacer; forming a first isolation section in a region of the bulk semiconductor substrate through the trench; and filling the trench with a dielectric material to form a second isolation section.

According to embodiments of the present disclosure, it is possible to form an isolation section, such as STI, self-aligned to the space defined by the dummy gate spacer. As a result, each isolation needs only one dummy gate, and thus the footprint of the isolation section can be reduced. Further, under said isolation section, an additional isolation section can be provided, by which it is possible to reduce leakage. The technology of the present disclosure is especially applicable to FinFETs.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Figure 1A:
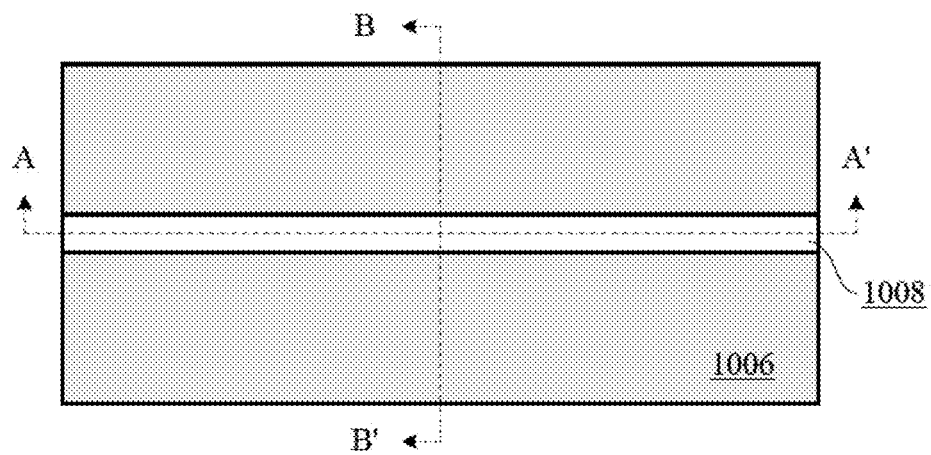
FIGS. 1(a)-21 are schematic views illustrating some steps of a process for manufacturing a semiconductor arrangement in accordance with an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

According to an embodiment of the present disclosure, a semiconductor arrangement is provided. The semiconductor arrangement is manufactured, for example, on a bulk semiconductor substrate. The semiconductor arrangement may comprise a first semiconductor device and a second semiconductor device disposed adjacent to each other on the substrate. The first and second semiconductor devices can be of the same conductivity type or of different conductivity types. Such semiconductor devices may comprise FinFETs, for example. In this case, each of the semiconductor devices may comprise a fin and a gate stack intersecting the fin. For example, the fin may be achieved by patterning the substrate. In some examples, the first semiconductor device and the second semiconductor device may share a common fin. Further, on sidewalls of the gate stack, a gate spacer may be formed.

In order to electrically isolate the first semiconductor device from the second semiconductor device (if required), a first isolation section, such as Shallow Trench Isolation (STI), may be formed therebetween. Such an isolation section may be self-aligned to a space defined by a dummy gate spacer (in its inner side) disposed between the first semiconductor device and the second semiconductor device. Such a self-aligned isolation section may be formed by performing etching with the dummy gate spacer as a mask to form a trench (thus having sidewalls extending substantially along inner walls of the dummy gate spacer), and then filling a dielectric material into the trench.

For example, the dummy gate spacer may be manufactured according to the same processes as those for the respective gate spacers of the first semiconductor device and the second semiconductor device. Further, a dummy gate stack may be formed according to the same processes as those for the respective gate stacks of the first semiconductor device and the second semiconductor device. In other words, a dummy device (comprising the dummy gate stack and the dummy gate spacer) similar to the first and/or second semiconductor devices may be formed between the first semiconductor device and the second semiconductor device. These devices (including the dummy device) may have substantially the same gate stacks and gate spacers, and their gate stacks and thus gate spacers may be substantially aligned with each other.

In a case where the first semiconductor device and the second semiconductor device share a common fin, the dummy gate structure may intersect the fin to form a dummy FinFET. That is, three devices (including one dummy device) that intersect the common fin may be formed. In this case, a dummy gate isolation section (or a trench) may extend to pass through the fin, such that respective active regions of the first semiconductor device and the second semiconductor device may be isolated from each other.

Source/drain regions of the respective semiconductor devices may be formed on opposite sides of the respective gate stacks in the substrate (in a case of FinFET, formed in the fin, for example). In an example, a further semiconductor layer which is at least partially embedded into the fin may be formed, and the source/drain regions may be formed at least partially in the further semiconductor layer. The further semiconductor layer may comprise a material different from that of the substrate, to apply stress to a channel region. For example, for an N-type device, tensile stress may be applied; and for a P-type device, compressive stress may be applied.

In an example, the semiconductor arrangement may further comprise a second isolation section formed under, preferably, substantially aligned to, the first isolation section. The second isolation section may abut the first isolation section. The second isolation section may extend substantially along the space defined by the dummy gate spacer (or along the isolation section), and may extend beyond this space (or the first isolation section) in a lateral direction. The second isolation section may comprise at least one of an insulation layer, a pn junction isolation, or a doped semiconductor isolation.

The substrate may comprise a doped well, and the second isolation section may be disposed at least partially in the doped well (for example, in an upper portion of the doped well having a bottom surface at a level lower than the bottom surface of the doped well) and defined between the first semiconductor device and the second semiconductor device. In a case of FinFET, a sidewall of the second isolation section facing the first FinFET may be closer to the first FinFET than a sidewall of the first isolation section facing the first FinFET, and a sidewall of the second isolation section facing the second FinFET may be closer to the second FinFET than a sidewall of the first isolation section facing the second FinFET. Further, this second isolation section may pass under the fin, for example, extending between the fin and the substrate.

Such a semiconductor arrangement can be manufactured as follows. For example, a first gate structure and a second gate structure, and also a dummy gate structure disposed therebetween may be formed on a substrate. Then, gate spacers may be formed on sidewalls of the respective gate structures. These processes for the gate structures and the dummy gate structure may be performed in the same way. In other words, these processes may be performed as if three gate structures were formed. For example, a gate dielectric layer and a gate conductor layer may be formed on the substrate, and then may be patterned into three gate structures. A mask layer may be further formed on the gate conductor layer to protect the gate structures in subsequent processes. After that, the gate structures and the gate spacers may be used to manufacture devices (for example, forming of source/drain regions). The processes for manufacturing the devices may also be performed on the dummy gate structure (resulting in a dummy device).

These semiconductor devices (including the dummy device) may be FinFETs. In this case, before the gate structures are formed, a fin may be formed on the substrate. For example, the fin may be formed by patterning the substrate (and/or a semiconductor layer formed on the substrate). In an example, the first and second semiconductor devices and the dummy device may share a common fin. That is, their respective gate structures may intersect the same fin. A first isolation section may be formed in a region on the substrate in which the dummy gate structure is to be formed. The first isolation section may pass under the fin and abut the fin. The first isolation section may be achieved by implanting specific species into this region. For example, oxygen or dopants may be implanted. Oxygen can react with the substrate to produce an insulating layer, which serves as the isolation section. Dopants may be implanted into this region, to form a doped semiconductor region. The doped semiconductor region may have a dopant concentration higher than that in a well region of the substrate, to suppress leakage, as will be described in more detail in the following. Further, the doped semiconductor region may form a pn junction with the well region, for example, when the dopants have an opposite conductivity type to that of the well region.

After manufacturing the devices (for example, the forming of the source/drain regions), a trench self-aligned to a space defined by the dummy gate spacer may be formed. This trench may extend to the first isolation section. For example, in a case of FinFET, it may pass through the fin. A second isolation section may be formed by filling the trench with a dielectric material.

Such a trench may be formed, for example, as follows. A mask layer may be formed to mask the region for the first semiconductor device and the region for the second semiconductor device, and to expose at least the space defined by the dummy gate spacer (which is occupied by the dummy gate structure at this time). For example, the mask layer may extend onto the dummy gate spacer, but expose the dummy gate structure. After that, the dummy gate structure may be selectively etched with respect to the dummy gate spacer, and the fin may be further selectively etched, to form the trench. The mask layer may comprise a stack of oxide and nitride, and the first gate spacer, the second gate spacer, and the dummy gate spacer may comprise nitride.

According to an embodiment of the present disclosure, the gate-last process may be used in manufacturing the devices. In this case, the gate dielectric layer and the gate conductor layer as described above may be a sacrificial dielectric layer and a sacrificial conductor layer. After the source/drain regions are formed, the sacrificial gate structures inside the respective gate spacers may be removed, and spaces defined by the respective gate spacers may filled with replacement gate stacks (each comprising a replacement gate dielectric layer and a replacement gate conductor layer). In this case, the replacement gate dielectric layer may extend on inner walls of the respective gate spacers. In etching the trench, a portion of the replacement gate dielectric layer which is located on the inner walls of the dummy gate spacer may be reserved.

According to an embodiment of the present disclosure, in order to further improve device performances, the epitaxial source/drain technology may be used. For example, a further semiconductor layer which is at least partially embedded into the fin may be formed on respective opposite sides of the first gate spacer and/or the second gate spacer. Such a further semiconductor layer may be formed, for example, as follows. In particular, the fin may be selectively etched with the respective gate structures and gate spacers as a mask, such that a trench may be formed therein, and the further semiconductor layer may be grown epitaxially in the trench. During the epitaxial growth, in-situ doping may be performed.

In the above embodiments, the first isolation section is formed before the manufacture of the FinFETs. Alternatively, the FinFETs, including the dummy FinFET, may be manufactured firstly. Then, the space defined by the gate spacers for the dummy FinFET may be released to form a trench into the substrate. The first isolation section may be formed by ion implantation through the trench, and then the second isolation section may be formed b filling the trench with dielectric.

The present disclosure can be presented in various ways, some of which will be illustrated in the following.

FIGS. 1(a)-21 are schematic views illustrating some steps of a process for manufacturing a semiconductor arrangement in accordance with an embodiment of the present disclosure.

Figure 1B:
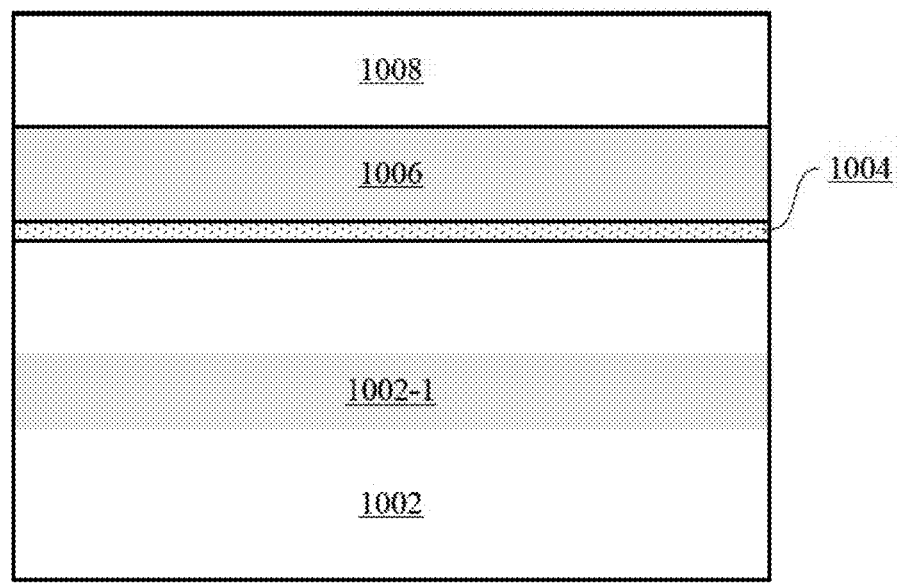
Figure 1C:
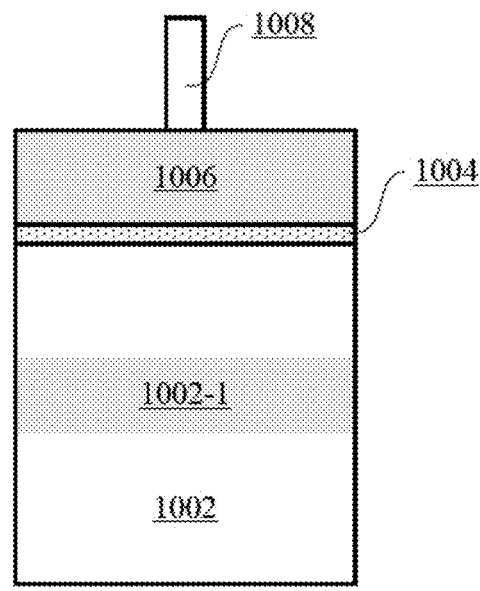

As shown in FIGS. 1(a), 1(b), and 1(c) (FIG. 1(a) is a top view, FIG. 1(b) is a cross sectional view taken along line AA' in FIG. 1(a), and FIG. 1(c) is a cross sectional view taken along line BB' in FIG. 1(a)), a bulk substrate 1002 is provided. The substrate may comprise any suitable bulk semiconductor material, such as, Si, Ge, and/or SiGe, etc. Hereinafter, silicon system materials are described by way of example, but the present disclosure is not limited thereto.

In the substrate 1002, a well region 1002-1 may be formed by, for example, ion implantation. For example, for a P-type device, an N-type well region may be formed; and for an N-type device, a P-type well region may be formed. For example, the N-type well region may be formed by implanting N-type dopants, such as P or As, into the substrate 1002, and the P-type well region may be formed by implanting P-type dopants, such as B, into the substrate 1002. If needed, annealing may be performed after the implantation. One skilled in the art may contemplate various ways to form an N-type well and/or a P-type well, and thus detailed descriptions thereof are omitted for simplicity. Further, the well region 1002-1 may comprise portions of different conductivity types, especially when devices of different conductivity types are to be formed on the substrate.

On the substrate 1002, a mask layer may be formed by, for example, deposition. The mask layer may comprise a stack of an oxide layer 1004 (such as, silicon oxide) with a thickness of about 5-20 nm and a nitride layer 1006 (such as, silicon nitride) with a thickness of about 50-150 nm. On the mask layer, photoresist 1008 may be formed. The photoresist 1008 may be patterned into a fin-like shape by, for example, photolithography, to facilitate forming a fin on the substrate subsequently.

Figure 2A:
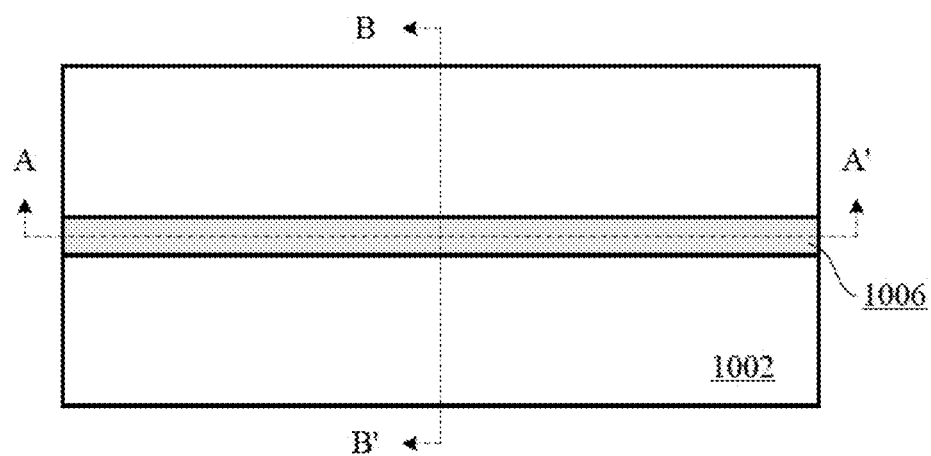
Figure 2B:
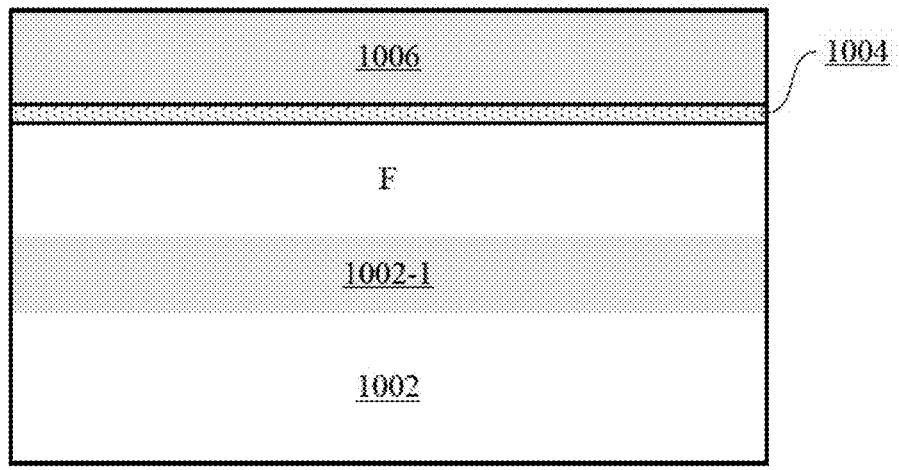
Figure 2C:
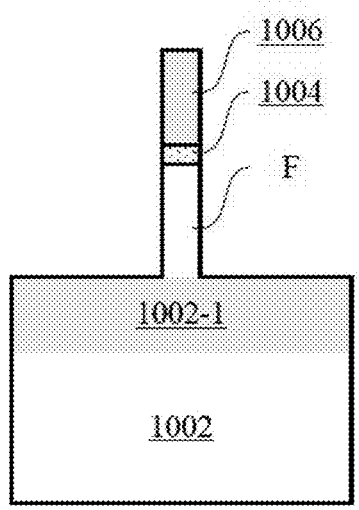

Next, as shown in FIGS. 2(a), 2(b), and 2(c) (FIG. 2(a) is a top view, FIG. 2(b) is a cross sectional view taken along line AA' in FIG. 2(a), and FIG. 2(c) is a cross sectional view taken along line BB' in FIG. 2(a)), the mask layer and the substrate 1002 may be selectively etched in sequence by, for example, Reactive Ion Etching (RIE), with the photoresist 1008 as a mask, thereby forming a fin F. After that, the photoresist 1008 may be removed.

In this example, the fin is formed by directly patterning the substrate. However, the present disclosure is not limited thereto. For example, an epitaxial layer may be formed on the substrate, and the fin may be formed by patterning the epitaxial layer. In the present disclosure, the expression "forming a fin on a substrate" means forming a fin a substrate in any appropriate manner, and the expression "a fin formed on a substrate layer" means any fin which is formed on a substrate in any appropriate manner.

Further, in the example as shown, in forming the fin F, the selective etching stops on a top surface of the well 1002-1. However, the present disclosure is not limited thereto. For example, the selective etching may enter into the well 1002-1.

Figure 3A:
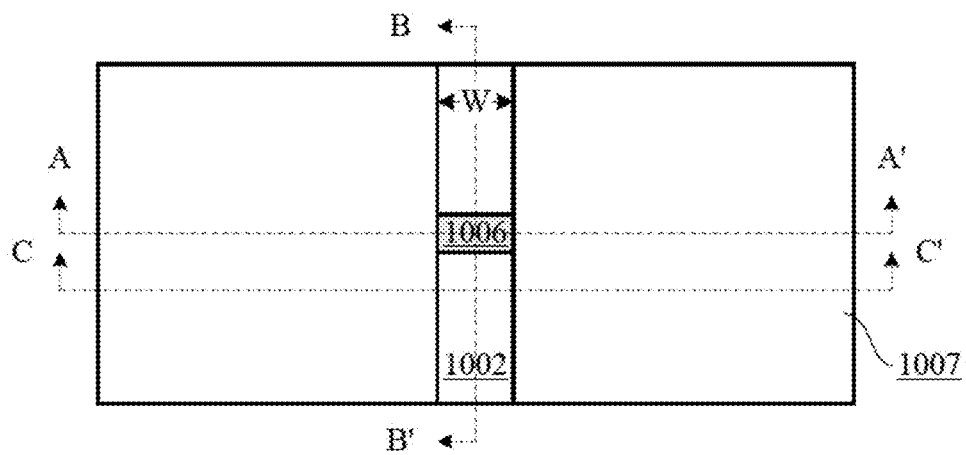
Figure 3B:
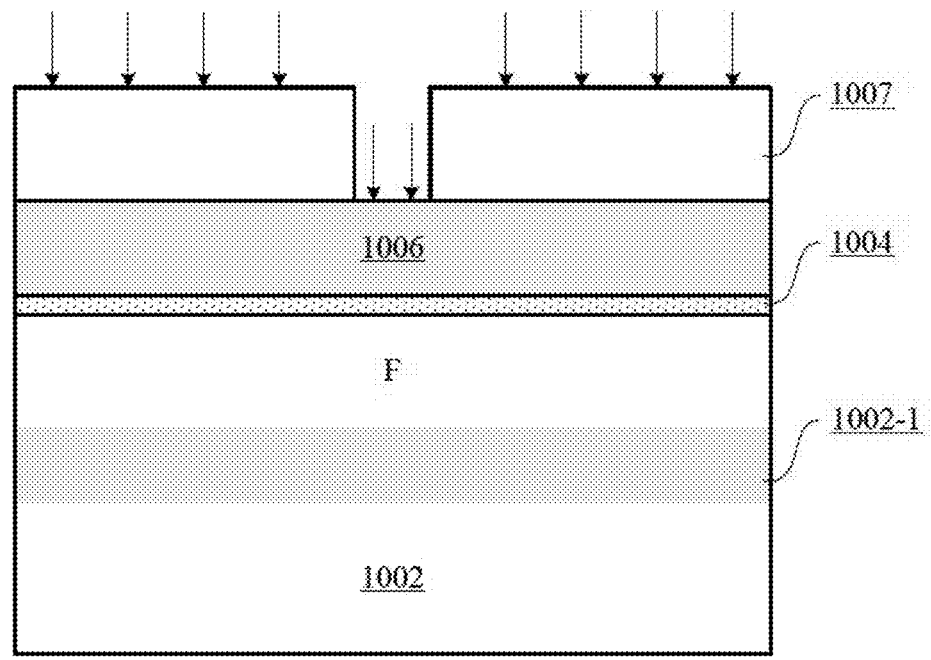

As shown in FIGS. 3(*a*), 3(*b*), and 3(*c*) (FIG. 3(*a*) is a top view, FIG. 3(*b*) is a cross sectional view taken along line AA' in FIG. 3(*a*), and FIG. 3(*c*) is a cross sectional view taken along line BB' in FIG. 3(*a*)), a mask layer 1007 (for example, photoresist) may be used to mask regions in which actual devices are to be formed subsequently, and to expose a region in which an isolation section is to be formed subsequently. Here, the exposed region may have a width W greater or less than a gate length of devices to be formed. After that, implantation may be performed as shown by arrows in the figure. For example, oxygen or dopants, may be implanted. In an example, the oxygen may be implanted at a dose of, for example, about $1E15$-$5E16$ $cm^{-2}$, or the dopants may have a peak concentration under the fin F of, for example, about $1E18$-$2E19$ $cm^{-3}$. For example, if the entire well region 1002-1 is n-type or p-type and a pnp or npn junction is expected to be formed (resulting in a pn junction isolation), the dopants may have a conductivity type opposite to that of the well region 1002-1. According to another embodiment, to increase the well concentration under the fin F, the dopants may have the same conductivity type as that in the well if the entire well is n-type or p-type. As shown in FIG. 3(*b*), for those regions covered by the mask layer 1007, there can be very little or even no the implanted species; while for the region not covered by the mask, there can be the implanted species. As shown in FIG. 3(*c*), due to scattering, the implanted species can enter the region under the fin. Then, the mask layer 1007 may be removed.

If devices of different conductivity types (for example, an N-type device and a P-type device) are to be formed (for example, adjacent to each other), the well 1002-1 can have two different portions: a n-type well in a P-type device region where the P-type device is to be formed and a p-type well in an N-type device region where the N-type device is to be formed, as shown in FIG. 3(*b*') or 3(*b*") (sectional views taken along line CC' in FIG. 3(*a*)). In this case, angular implantation can be conducted. For example, as shown in FIG. 3(*b*'), angular p-type implantation, directed towards the p-type well, may be conducted, to increase the p-type dopant concentration in at least some portion of the p-type well in the N-type device region. Further, as shown in FIG. 3(*b*"), angular n-type implantation, directed towards the n-type well, may be conducted, to increase the n-type dopant concentration in at least some portion of the n-type well in the P-type device region. In an example, the dopants may have a peak concentration under the opening of, for example, about $1E18$-$2E19$ $cm^{-3}$. Such a configuration helps suppressing punch-through between adjacent source/drains through the well.

Figure 4A:
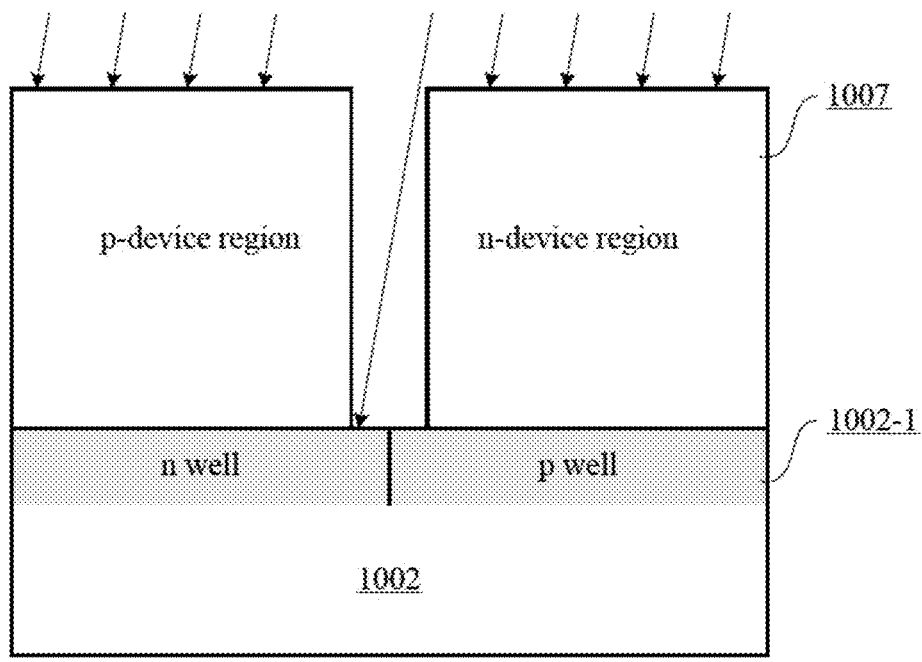
Figure 4A:
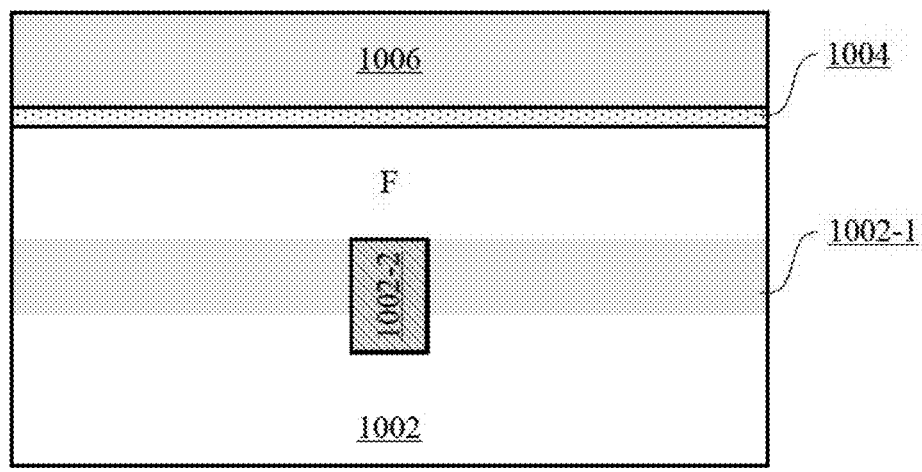
Figure 4B:
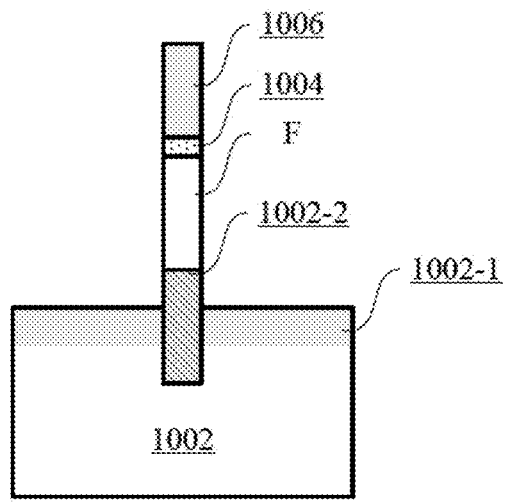

Then, as shown in FIGS. 4(*a*) and 4(*b*), the substrate 1002 may be further selectively etched by, for example, RIE. Due to the mask layer (1004/1006), the fin F keeps the fin-like shape, but with its depth enlarged. Annealing may be formed to form an isolation section 1002-2. In the case of oxygen, the oxygen may react with the substrate to form silicon oxide, an insulation layer. Alternatively, in the case of dopants, the dopants will be activated to form a doped region. For example, if the implanted dopants have a different conductivity type from the well region 1002-1, then it can form a pn junction isolation with the well region 1002-1. The isolation section 1002-2 may have a bottom surface lower than that of the well region 1002-1. In another embodiment, the well region 1002-1 can be formed by implantation after the annealing to prevent large diffusion of well dopants.

Figure 5:
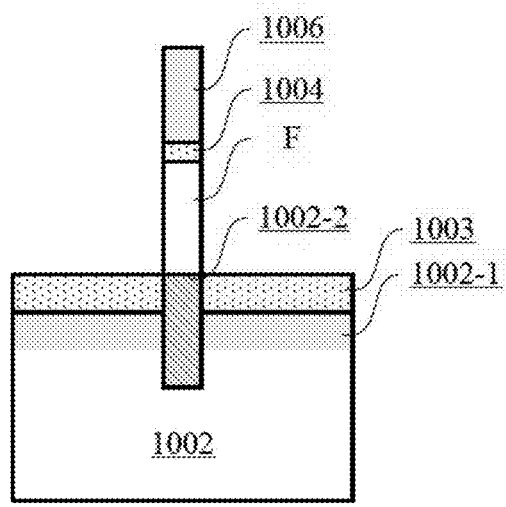

After that, as shown in FIG. 5, an isolation layer 1003 may be formed around the fin. For example, an oxide layer may be deposited, planarized by, for example, Chemical Mechanical Polishing (CMP), and then etched back, to form the isolation layer 1003. The isolation layer 1003 may have its top surface close to the top of the isolation section 1002-2. Further, the mask layer 1006 and 1004 may be removed by, for example, RIE.

After forming the fin and preferably the isolation section as described above, processes for manufacturing devices, such as forming gate stacks, forming source/drain, or the like, may be performed.

Figure 6A:
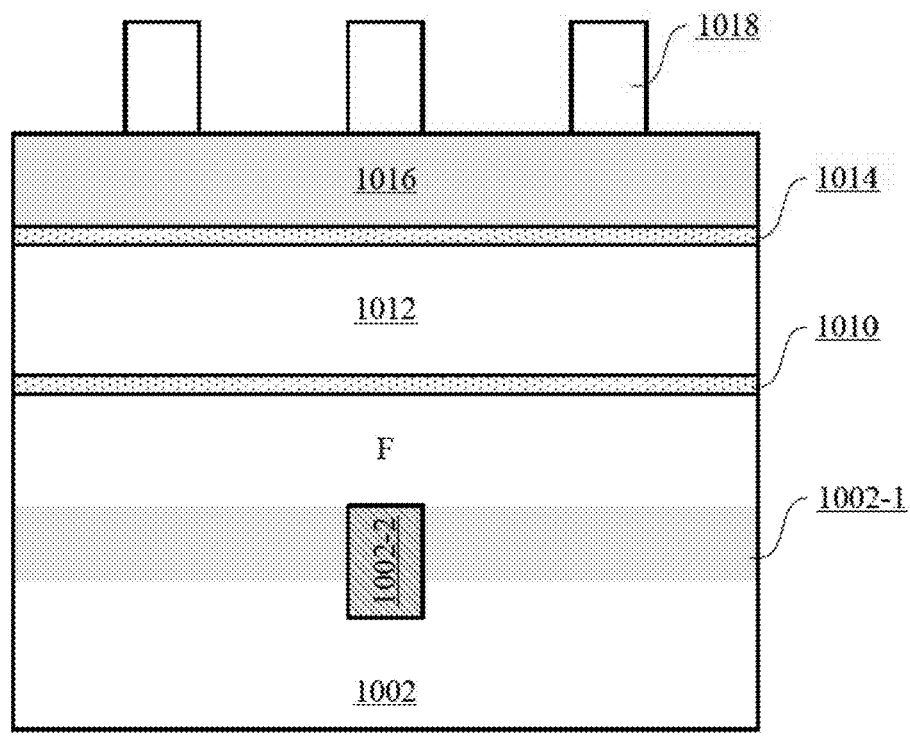
Figure 6B:
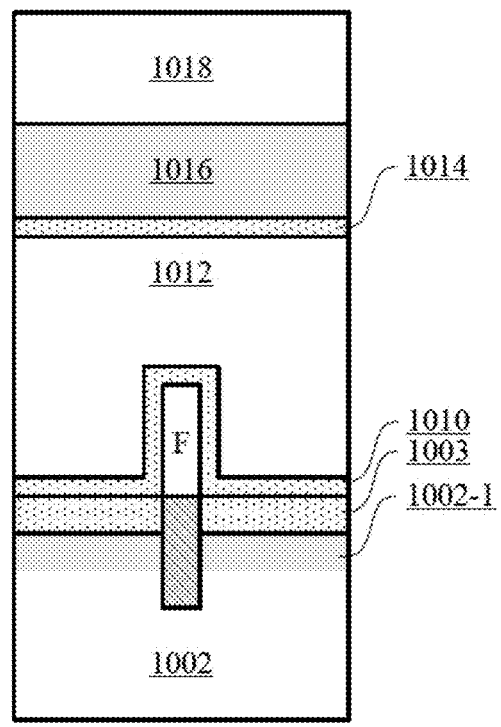

In particular, as shown in FIGS. 6(*a*) and 6(*b*), a sacrificial gate dielectric layer 1010 and a sacrificial gate conductor layer 1012 may be formed in sequence on the substrate by, for example, deposition. For example, the sacrificial gate dielectric layer 1010 comprises oxide with a thickness of about 1-5 nm, and the sacrificial gate conductor layer 1012 comprises crystalline silicon or amorphous silicon with a thickness of about 50-150 nm. If needed, the deposited sacrificial gate conductor layer 1012 may be planarized by, for example, Chemical Mechanical Polishing (CMP). After that, a mask layer may be formed on the sacrificial gate conductor layer 1012 by, for example, deposition. The mask layer may comprise a stack of an oxide layer 1014 with a thickness of about 3-5 nm and a nitride layer 1016 with a thickness of about 50-150 nm. On the mask layer, photoresist 1018 may be formed. The photoresist 1018 may be patterned by, for example, photolithography, into a shape corresponding to the gate stacks to be formed (referring to FIG. 7(*a*), in this example, patterned into three substantially parallel straight strips).

Figure 7A:
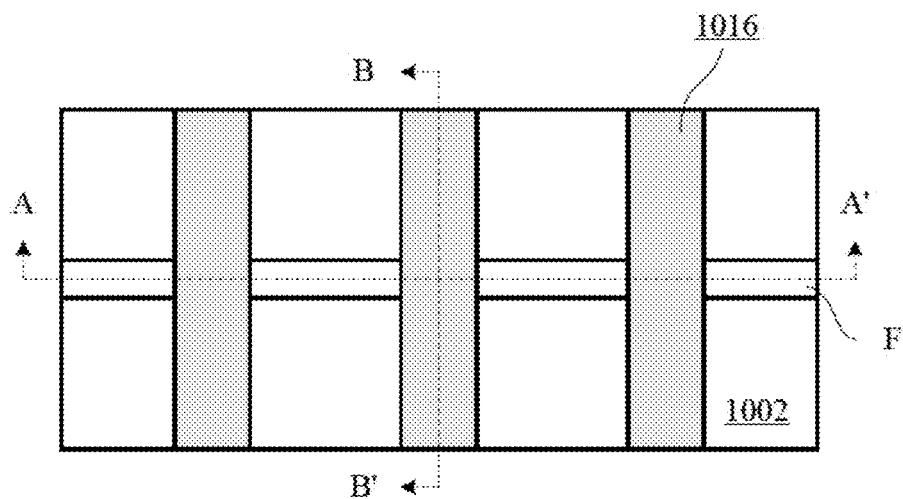
Figure 7B:
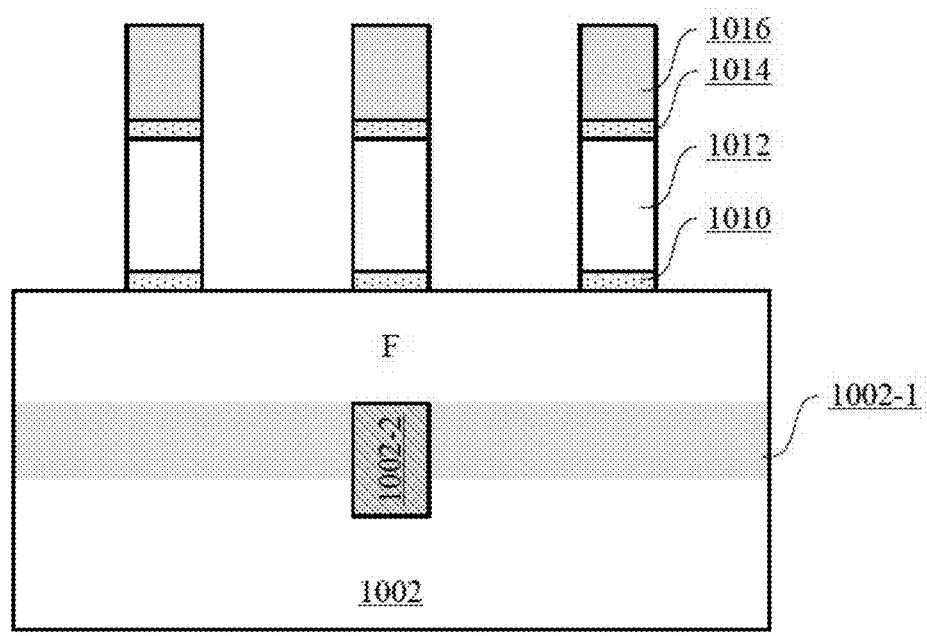
Figure 7C:
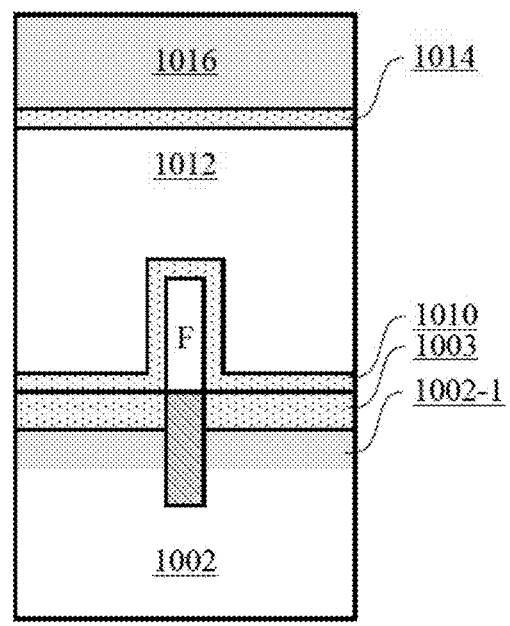

After that, as shown in FIGS. 7(*a*), 7(*b*), and 7(*c*) (FIG. 7(*a*) is a top view, FIG. 7(*b*) is a cross sectional view taken along line AA' in FIG. 7(*a*), and FIG. 7(*c*) is a cross sectional view taken along line BB' in FIG. 7(*a*)), the nitride layer 1016, the oxide layer 1014, the sacrificial gate conductor layer 1012, and the sacrificial gate dielectric layer 1010 may be selectively etched in sequence by, for example, RIE, with the photoresist 1018 as a mask. Subsequently, the photoresist 1018 may be removed. In this way, three strip-like gate structures are formed. Here, the so-called "gate structure" refers to one or more layers in the (sacrificial) gate stack or the (sacrificial) gate stack itself. For example, in the example as shown in the figure, the gate structure may refer to the sacrificial gate conductor layer 1012 and the sacrificial gate dielectric layer 1010 after being patterned (that is, the sacrificial gate stack itself).

Figure 8:
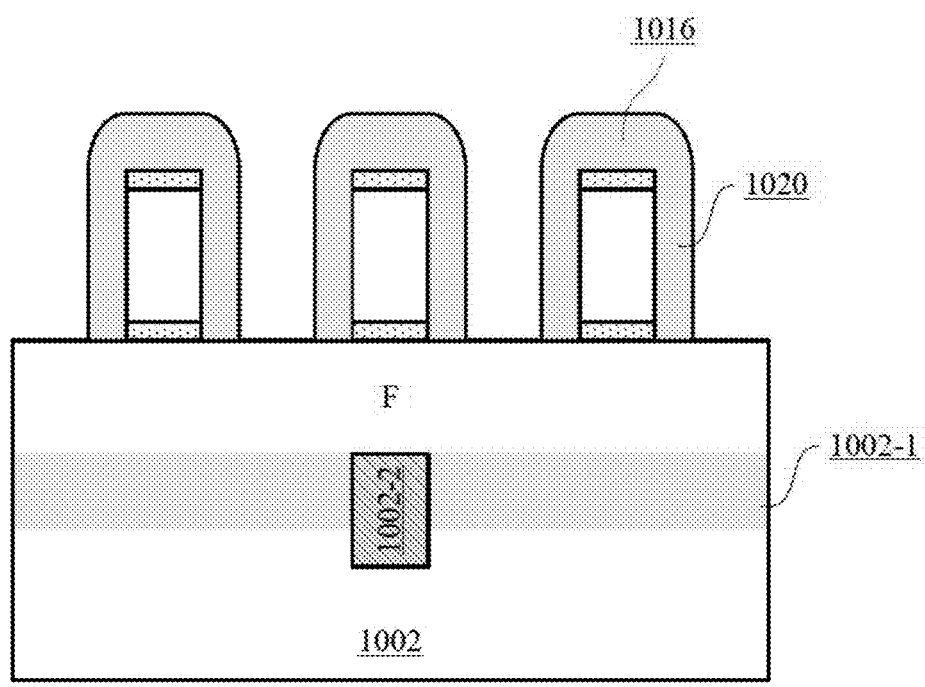

Subsequently, as shown in FIG. 8 (corresponding to the cross section shown in FIG. 7(*b*)), gate spacers 1020 may be formed on sidewalls of the respective gate structures. One skilled in the art knows various ways to form such spacers. For example, a layer of nitride may be deposited on the structure shown in FIG. 8 in a substantially conformal way, and then RIE may be performed on the layer of nitride in a substantially vertical direction to form the spacers 1020. The spacers 1020 each may have a width of about 5-30 nm. Here, the mask layer on top of the gate structures is not removed, mainly for the purpose of protecting the gate structures in subsequent processes. In this example, because both the nitride layer 1016 and the spacers 1020 comprise nitride, they are shown as a whole in the figures.

Figure 9:
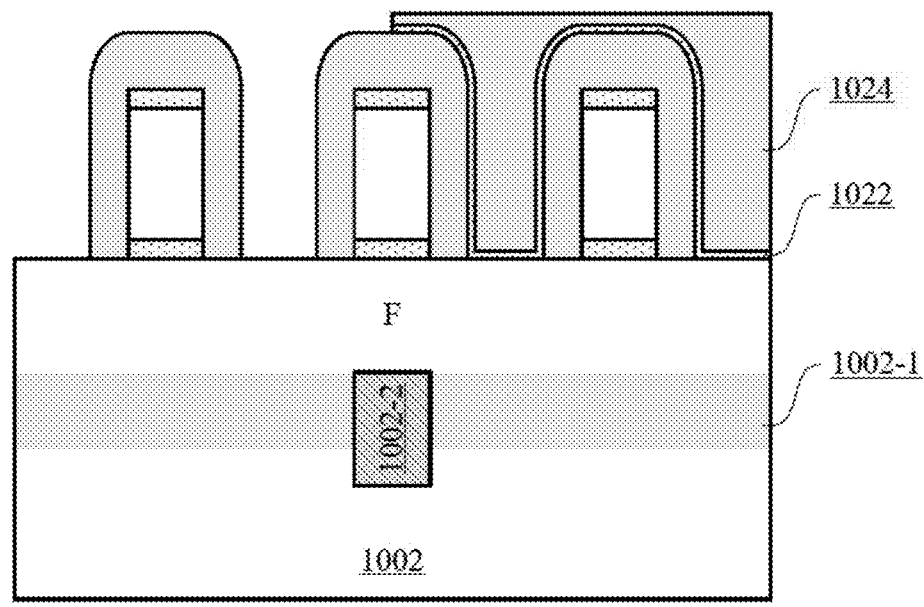

Here, a case where one P-type device and one N-type device are formed is described. In this case, as shown in FIG. 9, a region for the N-type device (the right region in the figure) may be masked by a mask layer. For example, the mask layer may comprise an oxide layer 1022 with a thickness of about 3-10 nm and a nitride layer 1024. This mask layer may extend onto a top surface of the middle gate structure, and expose a region for the P-type device (the left region in the figure).

Although a case where one P-type device and one N-type device, two devices in total, are formed is described here, the present disclosure is not limited thereto. The technology of the present disclosure is also applicable to form more or less semiconductor devices of the same type or different types.

Figure 10:
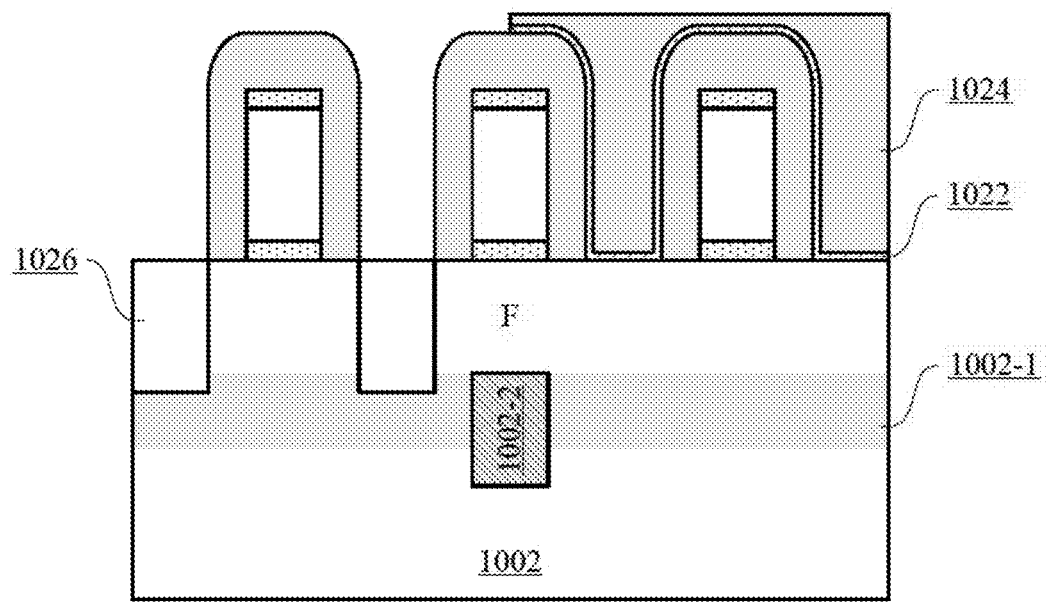

After that, as shown in FIG. 10, for the P-type device, a further semiconductor layer 1026 which is at least partially embedded into the fin F may be formed on opposite sides of the gate structure. In this example, the fin F is integral with the substrate 1002, and the semiconductor layer 1026 may even enter into the substrate 1002. The semiconductor layer 1026 may comprise a material different from that of the substrate 1002, for example, SiGe (with anatomic percentage of Ge of, for example, about 35-75%, and preferably, changed gradually), to apply compressive stress to a channel region. Such an embedded semiconductor layer may be formed, for example, as follows. Specifically, the fin F may be selectively etched by, for example, RIE, with the sacrificial gate structure (in this example, with the nitride layer disposed on a top surface thereof) and the gate spacer (in this example, nitride) as a mask (and the etching may enter into the substrate 1002), to form a trench. Subsequently, the trench may be filled (by, for example, epitaxial growth followed by etching-back) with a semiconductor material, such as, SiGe. The mask layer on the top surface of the sacrificial gate conductor layer can prevent the sacrificial gate conductor layer from being damaged when the fin F is being selectively etched (in this example, both the sacrificial gate conductor layer and the substrate layer comprise silicon).

In the figures, the semiconductor layer 1026 is shown to have a top surface flush with that of the fin F. However, the present disclosure is not limited thereto. For example, depending on the amount of the etching-back, the top surface of the semiconductor layer 1026 may be higher or lower.

The semiconductor material may be in-situ doped when it is being grown. For example, P-type doping may be performed for the P-type device. The in-situ doped semiconductor layer 1026 may then form source/drain regions of the semiconductor device. After that, the mask layer 1022 and 1024 may be removed by selective etching, such as, RIE.

Figure 11:
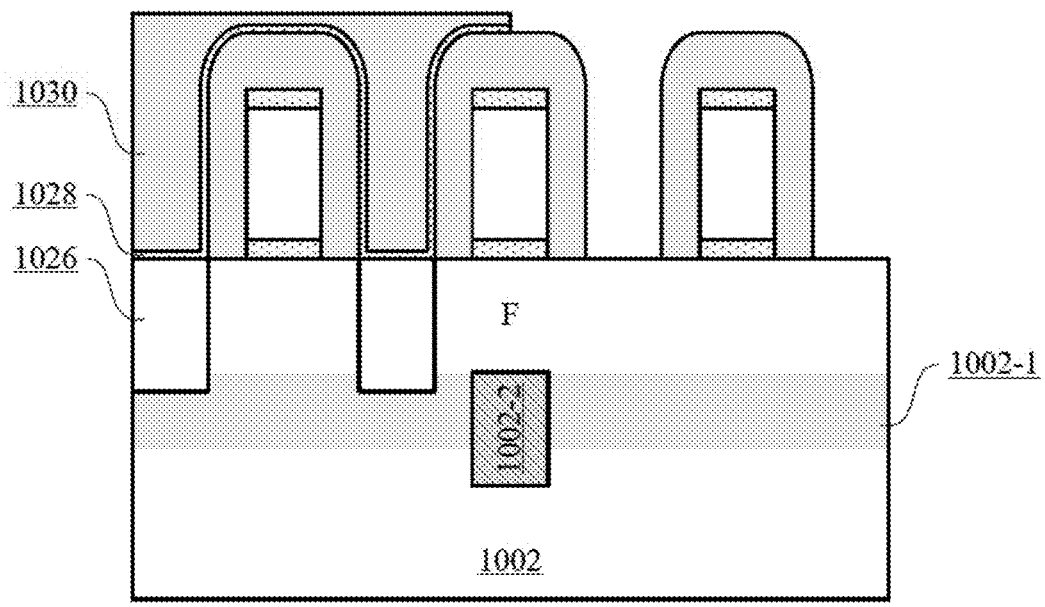

Likewise, similar processes may be performed on the N-type device on the other side. For example, as shown in FIG. 11, the region for the P-type device may be masked by a mask layer. For example, the mask layer may comprise an oxide layer 1028 with a thickness of about 3-10 nm and a nitride layer 1030. The mask layer may extend onto the top surface of the middle gate structure, and expose the region for the N-type device.

Figure 12:
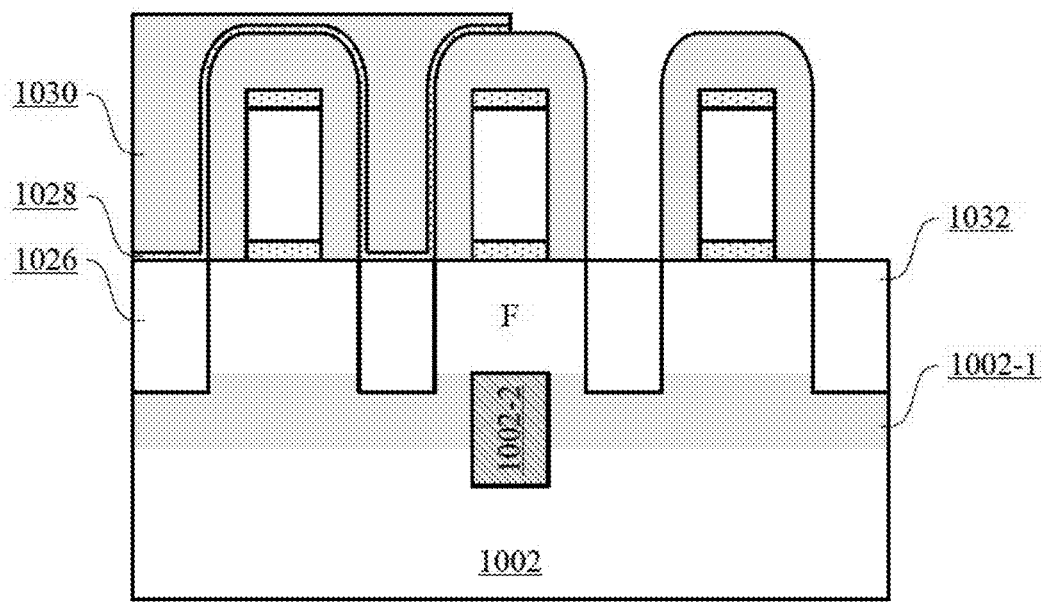
Figure 13:
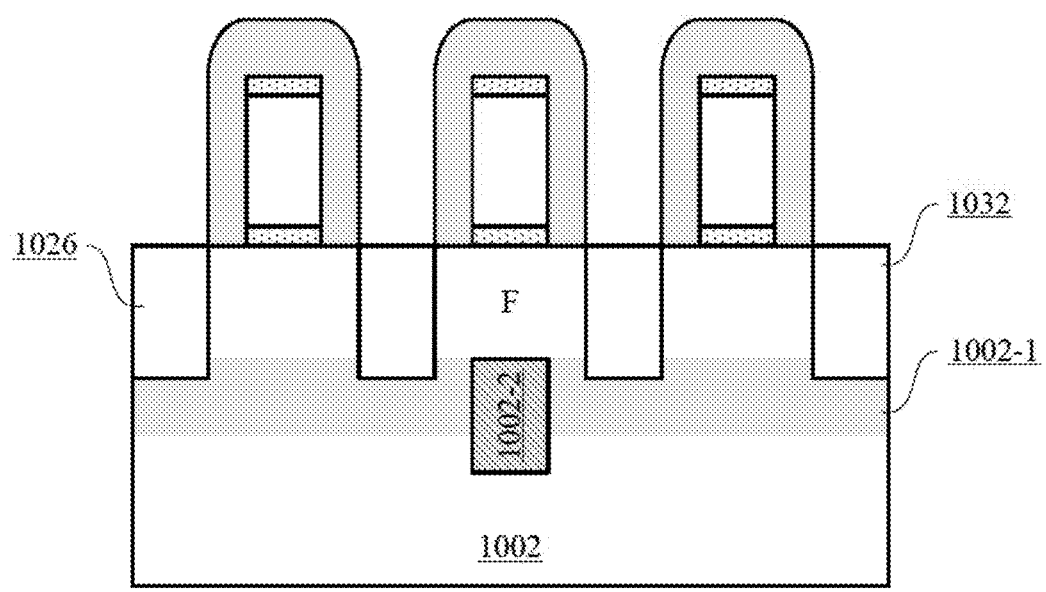

After that, as shown in FIG. 12, a further semiconductor layer 1032 which is at least partially embedded into the fin F may also be formed on opposite sides of the gate structure of the N-type device. In this example, the fin F is integral with the substrate 1002, and the semiconductor layer 1032 may even enter into the substrate 1002. The semiconductor 1032 may comprise a material different from that of the substrate 1002, for example, Si:C (with an atomic percentage of C of, for example, about 0.32%), to apply tensile stress to a channel region. Such an embedded semiconductor layer may be formed, for example, as described above. The semiconductor material may be in-situ doped when it is being grown. For example, N-type doping may be performed for the N-type device. The in-situ doped semiconductor layer 1032 may then form source/drain regions of the semiconductor device. After that, the mask layer 1030 and 1028 may be removed by selective etching, such as, RIE, as shown in FIG. 13. In removing the layer 1030, the region for the N-type device may be covered by, for example, photoresist, to avoid the nitride layer 1020 from being removed.

Although an example in which embedded source/drain regions are epitaxially grown is described, the present disclosure is not limited thereto. For example, the source/drain regions may be formed by directly implanting ions into the fin F.

After that, a gate replacement process may be performed.

Figure 14:
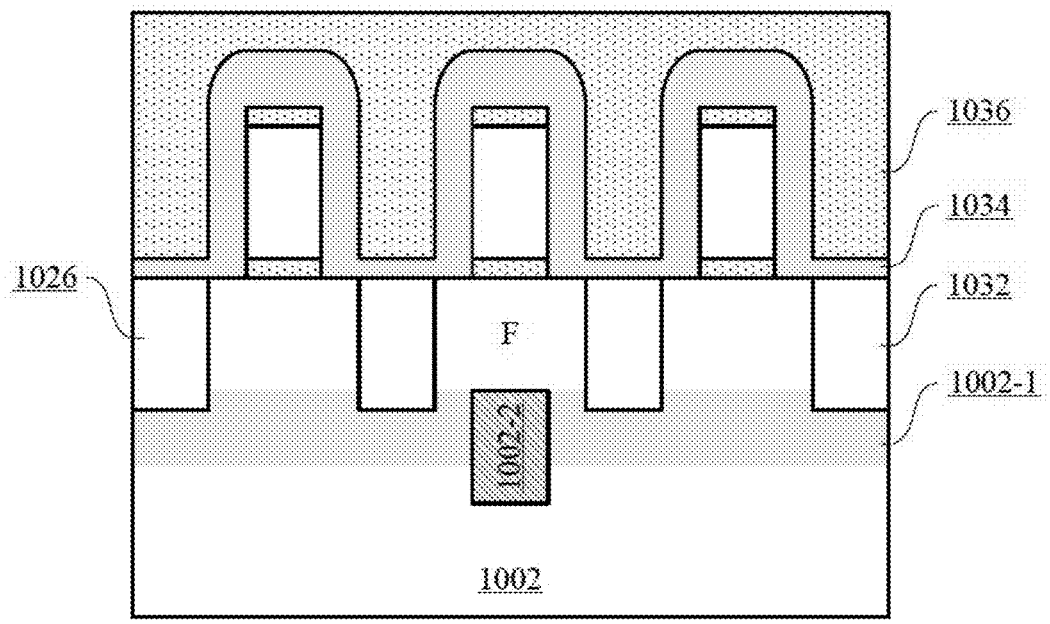

For example, as shown in FIG. 14, an interlayer dielectric layer 1036 may be formed on the substrate by, for example, deposition. The interlayer dielectric layer 1036 may comprise oxide with a thickness sufficient to fill up the space between respective gate structures. Further, an etching stop liner 1034 may be formed by, for example, deposition. The etching stop liner 1034 may comprise nitride with a thickness of about 5-20 nm. In this example, because the etching stop liner 1034, the gate spacers 1020, and the nitride layer 1016 in the mask all comprise nitride, they are shown as a whole. Furthermore, for convenience of drawing, the gate spacers 1020 and the nitride layer 1016 in the mask are not shown to be increased in thickness due to the deposited etching stop liner 1034.

Figure 15:
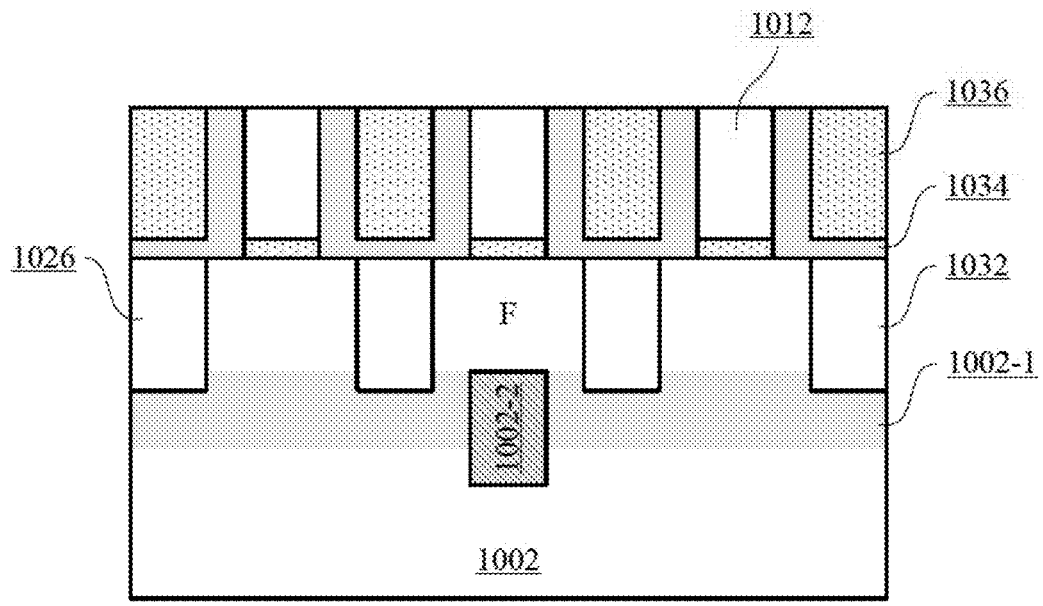
Figure 16:
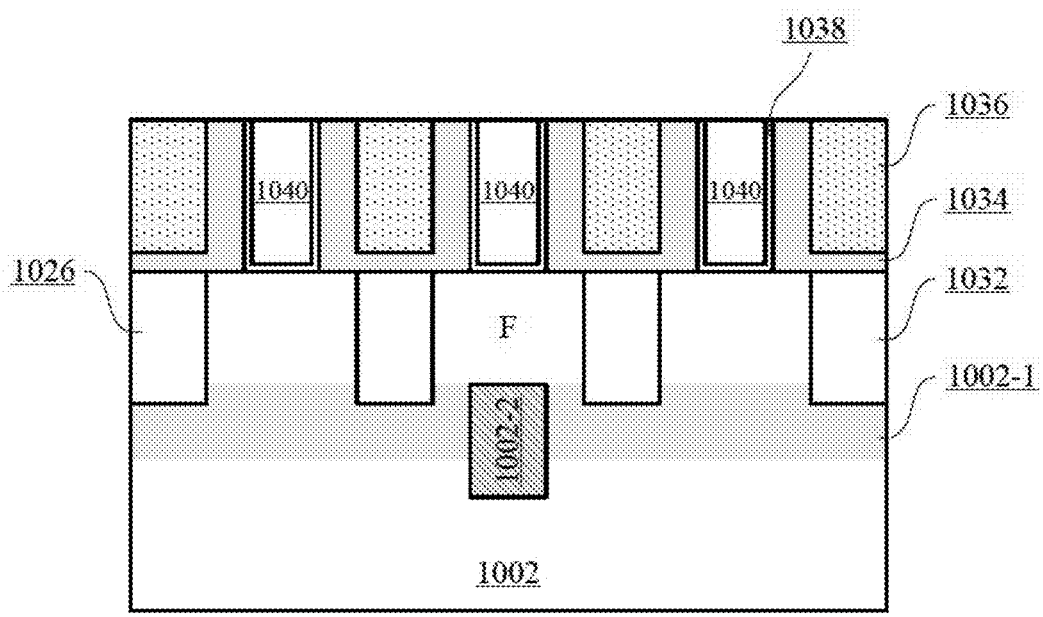

Subsequently, as shown in FIG. 15, a planarization process, such as, CMP, may be performed until the sacrificial gate structures are exposed. In particular, the sacrificial gate conductor layer 1012 is exposed. The sacrificial gate conductor layer 1012 may be removed by selective etching, for example, wet etching with a TMAH solution. The sacrificial gate dielectric layer 1010 may be further removed by selective etching, for example, wet etching with an HF solution or a BOE solution. In this way, trenches are formed inside the respective gate spacers 1020. After that, as shown in FIG. 16, replacement gate stacks may be formed in the respective trenches (by, for example, deposition followed by planarization). In particular, the replacement gate stacks each may comprise a replacement gate dielectric layer 1038 and a replacement gate conductor layer 1040. The replacement gate dielectric layer 1038 may comprise a high-K gate dielectric material, such as, $HfO_2$, with a thickness of about 2-4 nm, and the replacement gate conductor layer 1040 may comprise a metal gate conductor, such as, any one of TiN, TiAl, TaN, or TiC, or a combination thereof. For the N-type device and the P-type device, the replacement gate conductor layer 1040 may comprise materials with different work functions. Further, before the replacement gate stacks are formed, an interface layer (for example, oxide) with a thickness of about 0.3-1.5 nm may be formed.

Figure 17:
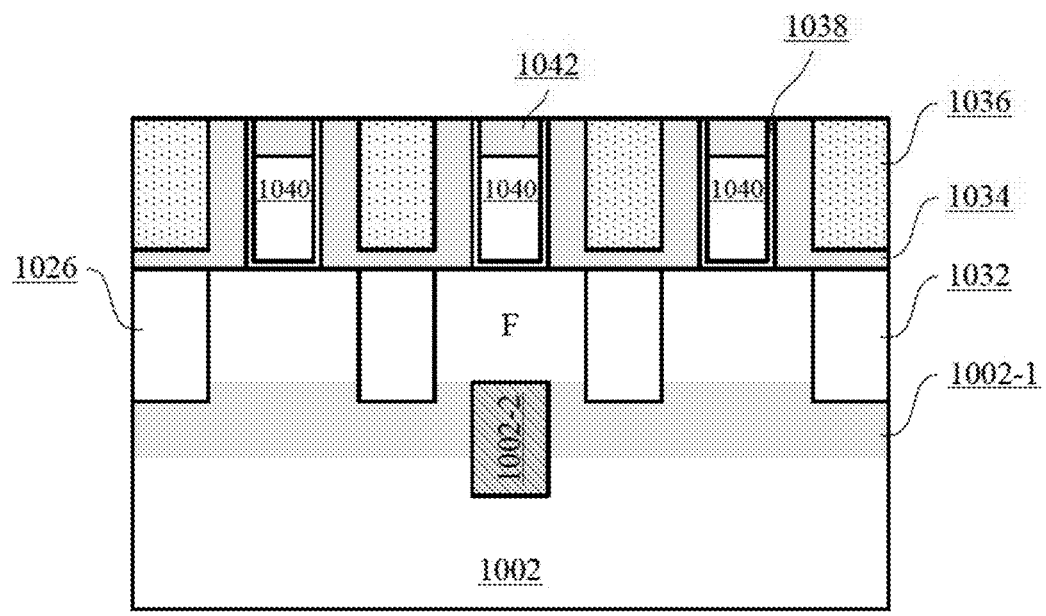

In an example of the present disclosure, the replacement gate conductor layer 1040 may be recessed, and then a dielectric material may be filled on top thereof. For example, as shown in FIG. 17, a part of the replacement gate conductor layer 1040 may be removed by selective etching, such as, RIE, and then spaces inside the respective gate spacers 1020, due to removal of the part from the top of the replacement gate conductor layer 1040, may be filled (by, for example, deposition followed by planarization) with a dielectric layer 1042, for example, nitride.

Figure 18:
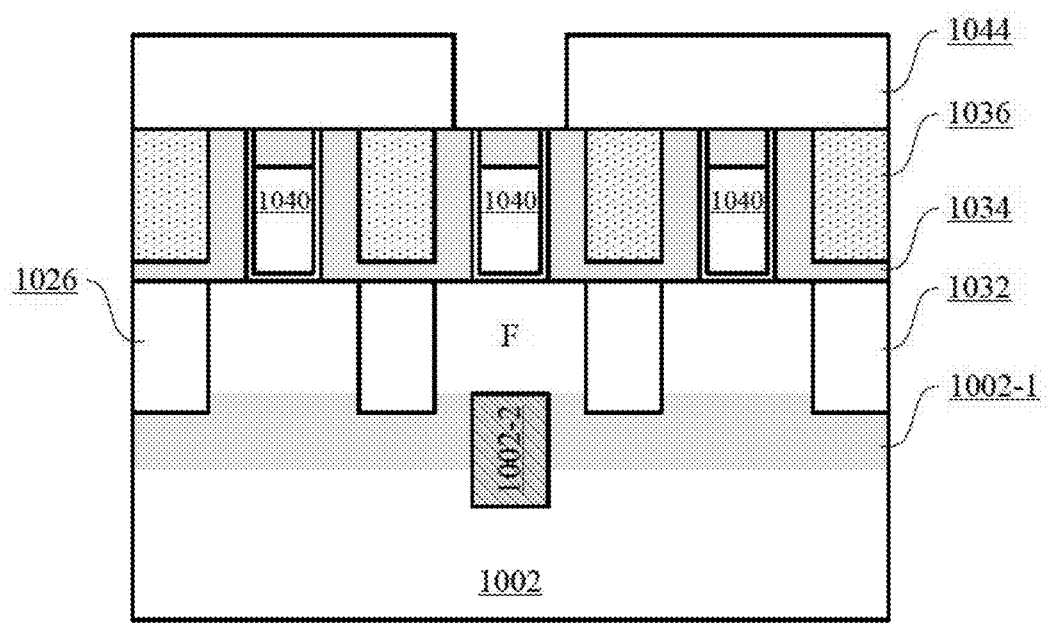
Figure 19:
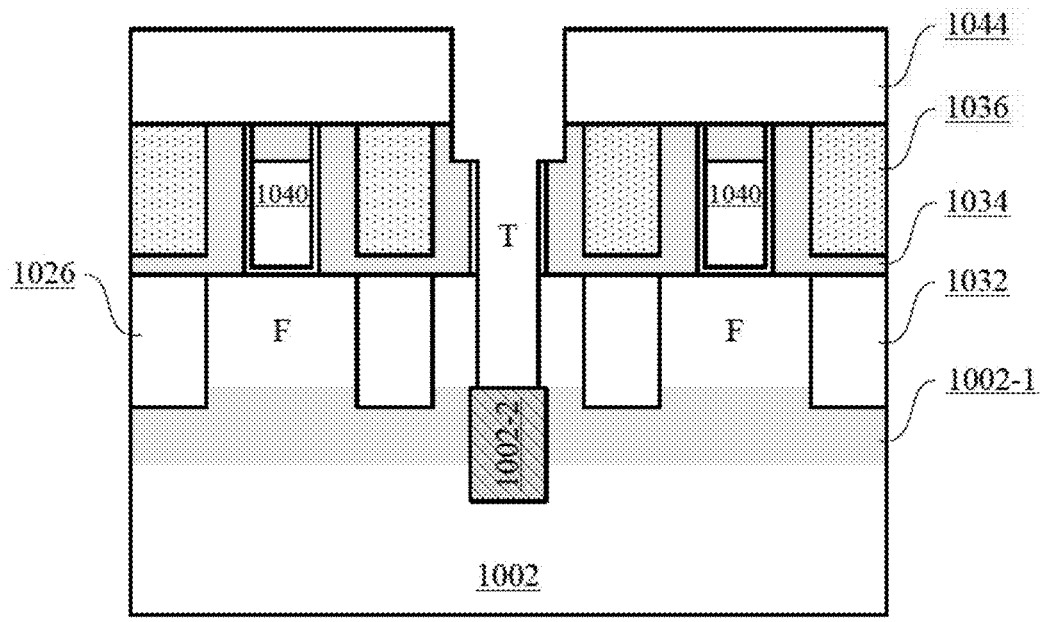

After that, as shown in FIG. 18, the region for the P-type device and the region for the N-type device may be masked by a mask layer 1044, for example, photoresist. For example, the mask layer 1044 may extend onto the top of the dummy gate spacer, and expose the region for the dummy gate stack. Subsequently, portions of the dielectric layer 1042, the replacement gate conductor layer 1040, the replacement gate dielectric layer 1038, and the fin F in this region may be removed in sequence by selective etching, for example, RIE. In this example, the etching may be stopped at the isolation section 1002-2, resulting in a trench T which passes through the fin F and reaches the isolation section 1002-2, as shown in FIG. 19. In this example, portions of the replacement gate dielectric layer 1038 on the sidewalls of the trench T are not removed. However, these portions of replacement gate dielectric layer 1038 may be also removed. After that, the mask layer 1044 may be removed.

Because the selective etching is performed with respect to the gate spacer 1020 (although in this embodiment, a part from its top may be removed when performing RIE on the dielectric layer 1042 of nitride), the trench T may be self-aligned to a space defined by the gate spacer 1020. In particular, the sidewalls of the trench T extends substantially along inner walls of the gate spacer 1020 (in this example, recessed inwardly by the thickness of the replacement gate dielectric layer 1038, and such a recess is negligible).

Figure 20:
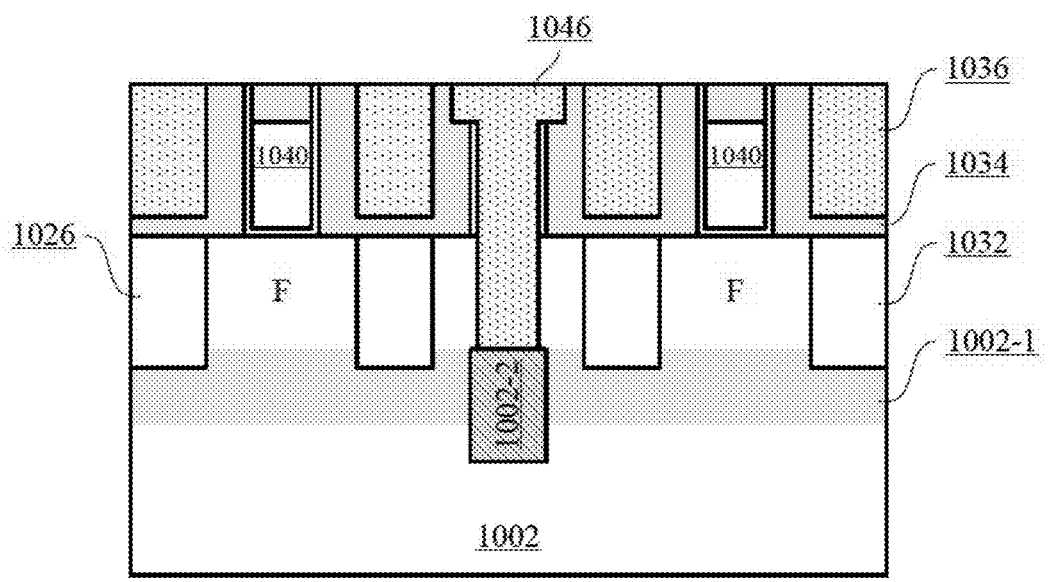

Next, as shown in FIG. 20, the trench T may be filled (by, for example, deposition followed by planarization) with a dielectric material, such as, oxides, to form a further isolation section 1046. Because the trench T is self-aligned to the space defined by the gate spacer 1020, the isolation section 1046 formed in the trench T is also self-aligned to the space defined by the gate spacer 1020.

Figure 21:
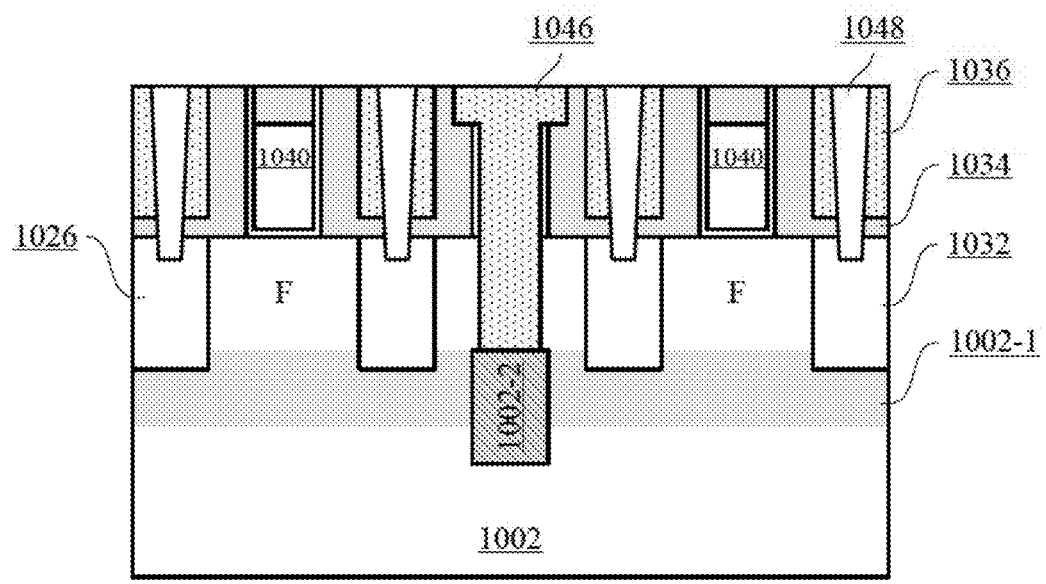

After the devices and the self-aligned isolation section are formed as described above, other peripheral components may be further formed. For example, as shown in FIG. 21, a source/drain contact 1048 may be formed. The source/drain contact 1048 may be formed by etching a contact hole and then filling the hole with a conducting material, such as, metal (for example, Cu or W).

As shown in FIG. 21, the semiconductor arrangement according to this embodiment of the present disclosure may comprise the P-type device and the N-type device. Each of the devices may comprise a respective gate stack (comprising the replacement gate dielectric layer 1038 and the replacement gate conductor layer 1040) and the gate spacer 1020 disposed on the sidewalls of the gate stack. Between the two devices, the dummy gate spacer may be formed. As described above, the isolation section 1046 is self-aligned to the space defined by the dummy gate spacer. Further, the isolation section 1002-1 is formed under the isolation section 1046 and abuts the isolation section 1046.

Figure 22A:
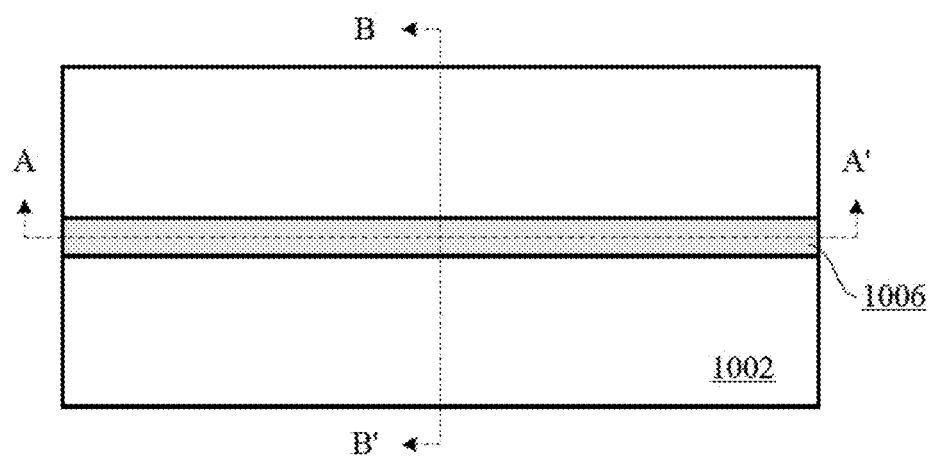
FIGS. 22(a)-36 are schematic views illustrating some steps of a process for manufacturing a semiconductor arrangement in accordance with another embodiment of the present disclosure.
Figure 22B:
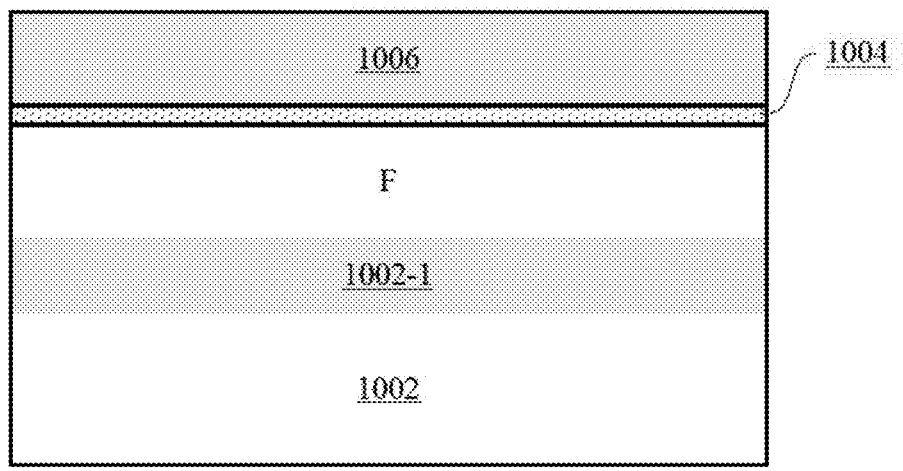
Figure 22C:
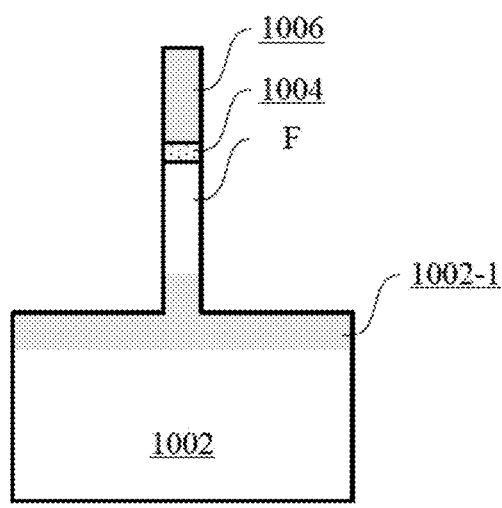

FIGS. 22(*a*)-36 are schematic views illustrating some steps of a process for manufacturing a semiconductor arrangement in accordance with another embodiment of the present disclosure.

Similarly, on a bulk substrate 1002 with a well region 1002-1 formed therein, a mask layer (1004/1006) may be formed, as described above with reference to FIGS. 1(*a*), 1(*b*), and 1(*c*). Then, as shown in FIGS. 22(*a*), 22(*b*), and 22(*c*) (FIG. 22(*a*) is a top view, FIG. 22(*b*) is a cross sectional view taken along line AA' in FIG. 22(*a*), and FIG. 22(*c*) is a cross sectional view taken along line BB' in FIG. 22(*a*)), a fin F may formed on the substrate 1002, as described above with reference to FIG. 2. Here, the etching to form the fin F may go into the well region 1002-1, so that the fin F have some portion of the well region 1002-1 in the bottom thereof, as shown in FIG. 22(*c*).

Figure 23:
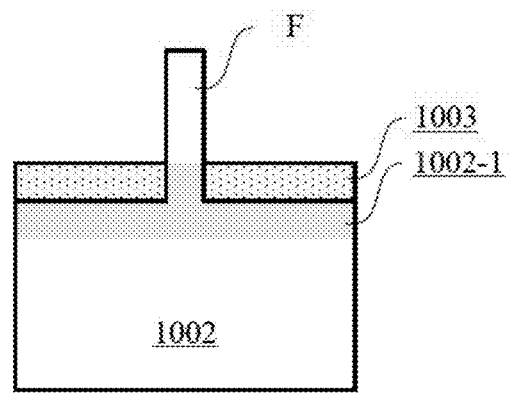

Then, as shown in FIG. 23, an isolation layer 1023 may be formed around the fin F, as described above with reference to FIG. 5. Here, the mask layer (1004/1006) may be removed by, for example, RIE.

After forming the fin as described above, processes for manufacturing devices, such as forming gate stacks, forming source/drain, or the like, may be performed.

Figure 24A:
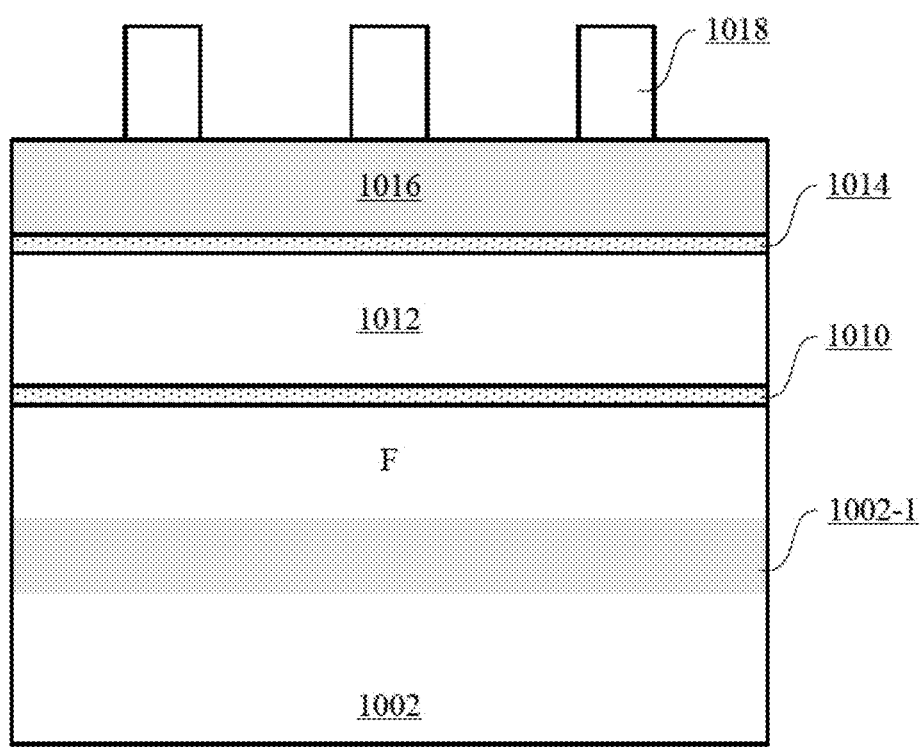
Figure 24B:
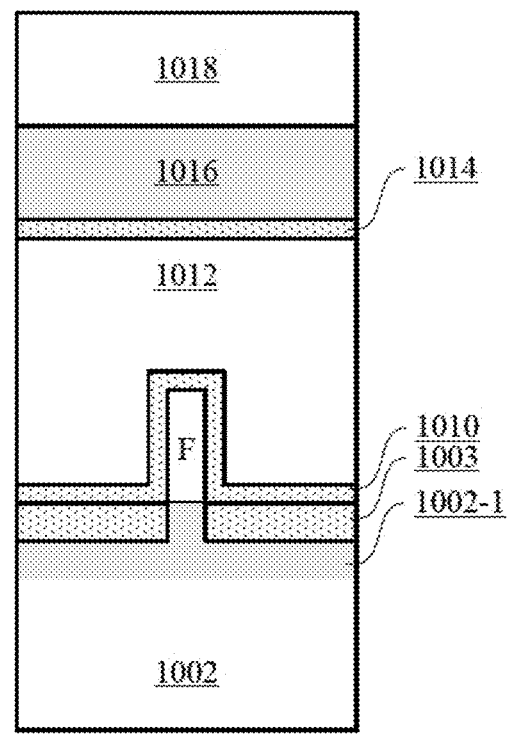

In particular, as shown in FIGS. 24(*a*) and 24(*b*), a sacrificial gate dielectric layer 1010 and a sacrificial gate conductor layer 1012 may be formed on the substrate, and a mask layer (1014/1016) may be formed on the sacrificial gate conductor layer 1012. Further, photoresist 1018 may be formed. Reference may be made to the above descriptions with reference to FIGS. 6(*a*) and 6(*b*).

Figure 25A:
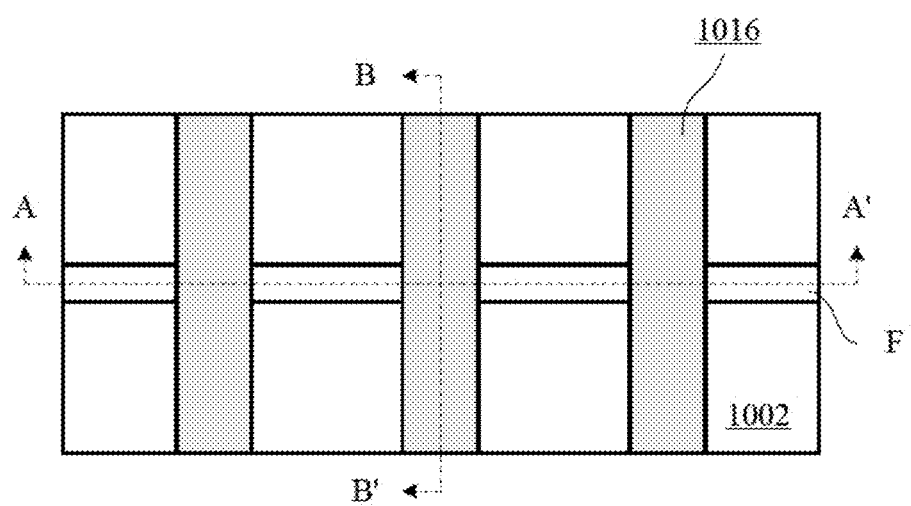
Figure 25B:
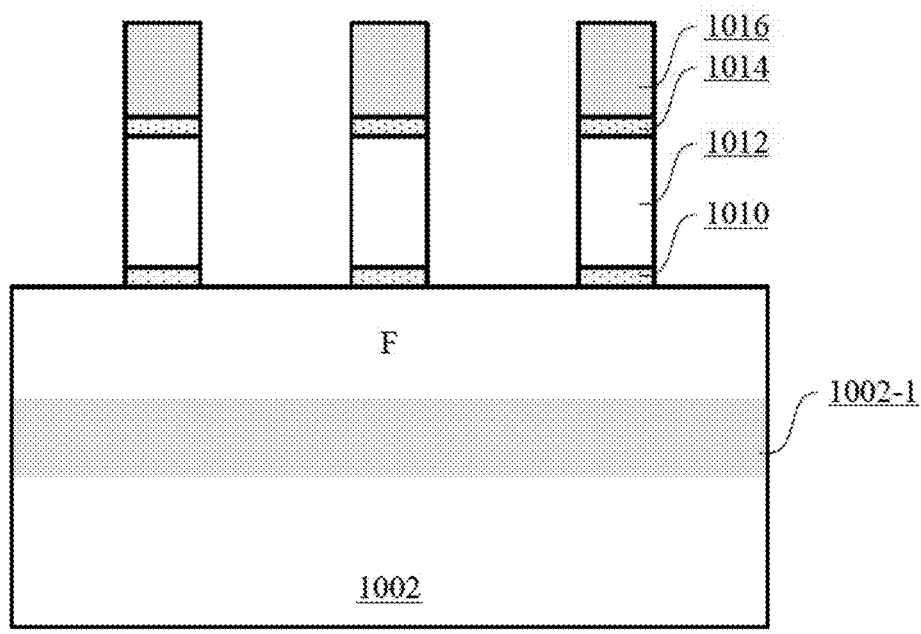
Figure 25C:
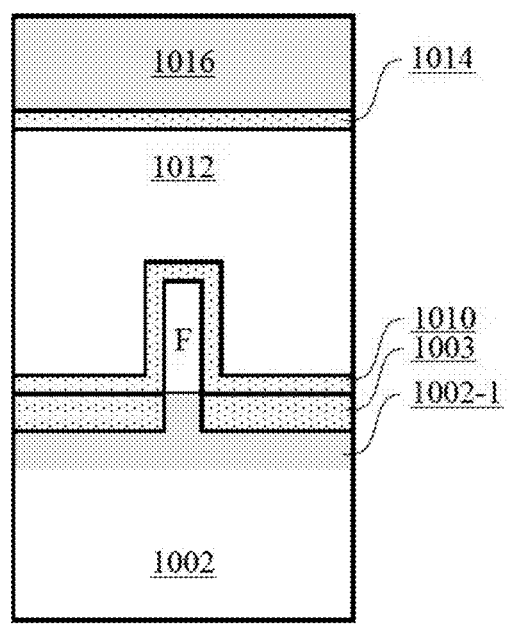

After that, as shown in FIGS. 25(*a*), 25(*b*), and 25(*c*), the sacrificial gate conductor layer 1012 and the sacrificial gate dielectric layer 1010 may be patterned into three strip-like gate structures, as described above with reference to FIGS. 7(*a*), 7(*b*), and 7(*c*).

Figure 26:
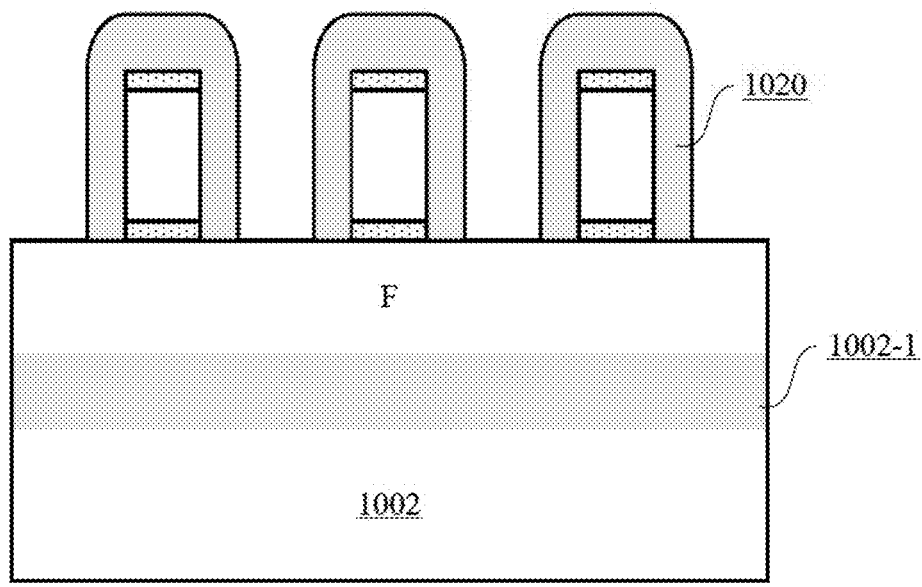

Then, as shown in FIG. 26, gate spacers 1020 may be formed on sidewalls of the respective gate structures, as described above with reference to FIG. 8. Likewise, the nitride layer 1016 and the spacers 1020 are shown as a whole.

Figure 27:
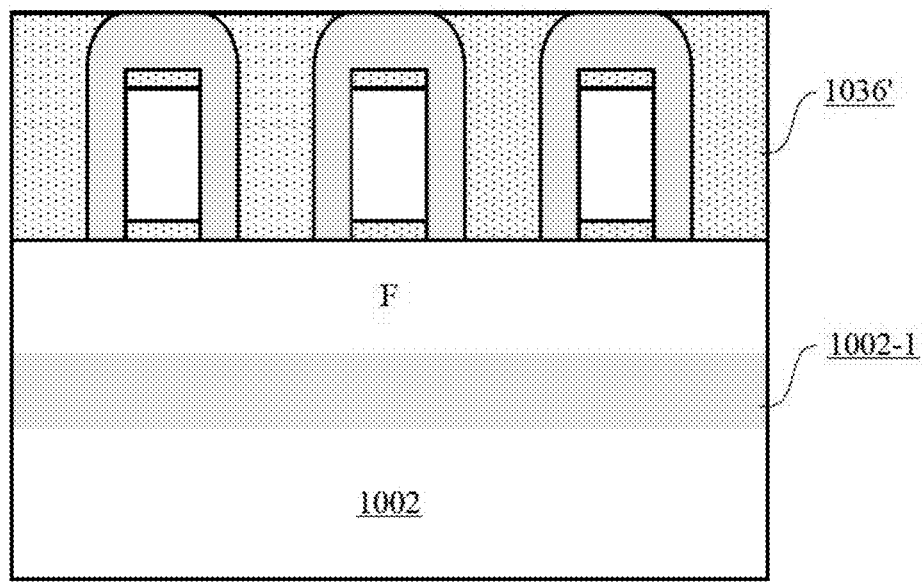

Subsequently, as shown in FIG. 27, an interlayer dielectric layer 1036' may be formed on the substrate by, for example, deposition. The interlayer dielectric layer 1036' may be planarized by, for example, CMP, so that the nitride 1020 is exposed.

Figure 28:
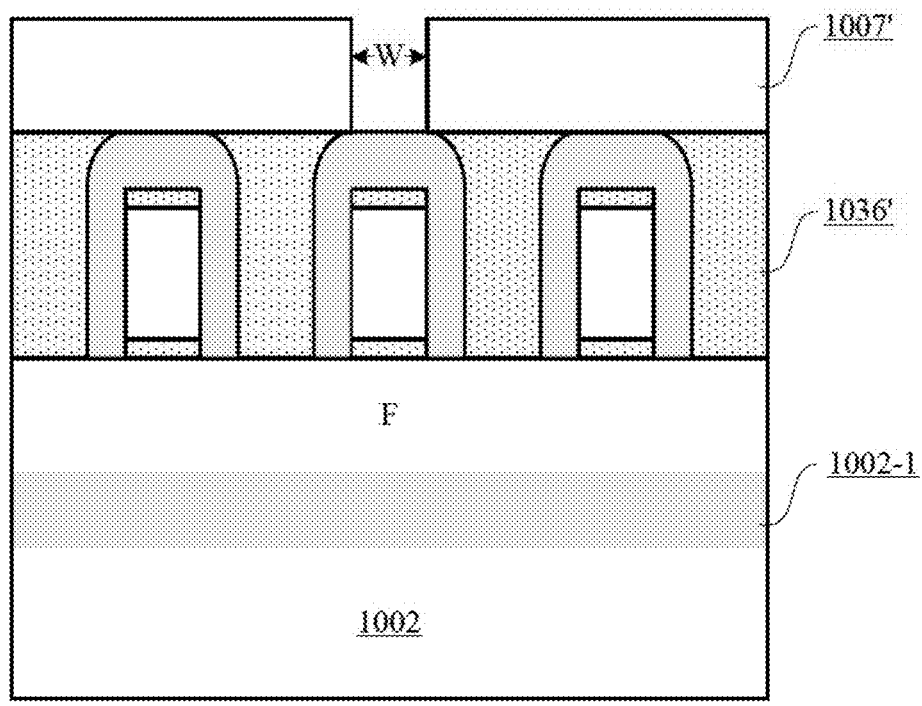

As shown in FIG. 28, a mask layer (for example, photoresist) 1007' may be used to mask regions in which actual devices are to be formed subsequently, and to expose a region in which an isolation section is to be formed subsequently. Here, the exposed region may have a width W greater or less than a gate length of devices to be formed.

Figure 29:
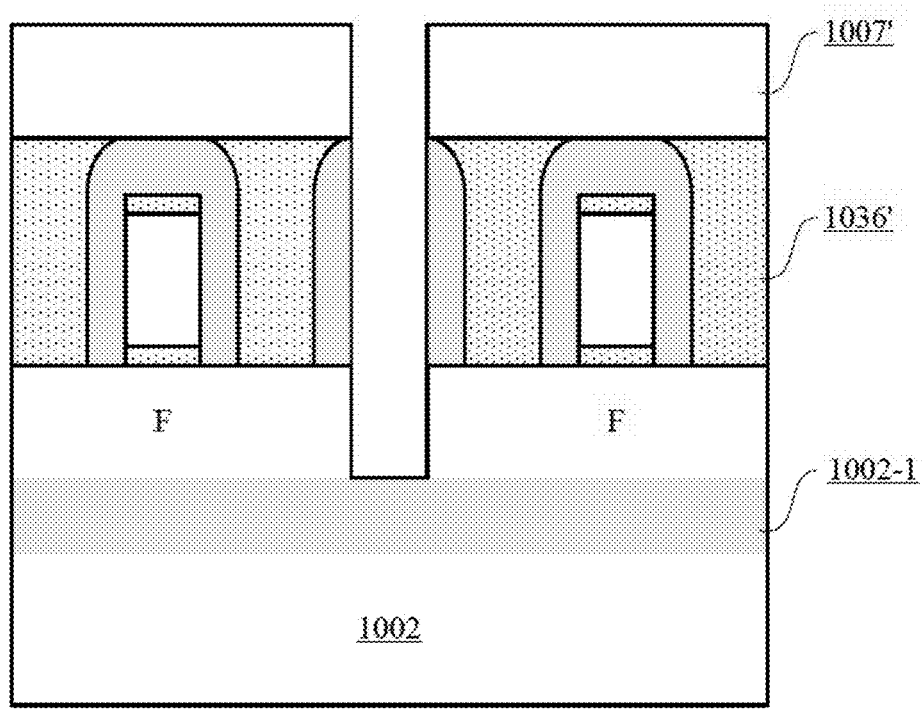

As shown in FIG. 29, using the mask layer 1007', an opening to the substrate 1002 and the fin F may be formed. Specifically, layers in the region not covered by the mask layer 1007' may be selectively etched by, for example, RIE in sequence to form the opening. This opening may have a bottom surface at substantially the same level as the top surface of the well region 1002-1 (by, for example, that the etching stops at the top surface of the well region 1002-1).

Figure 30A:
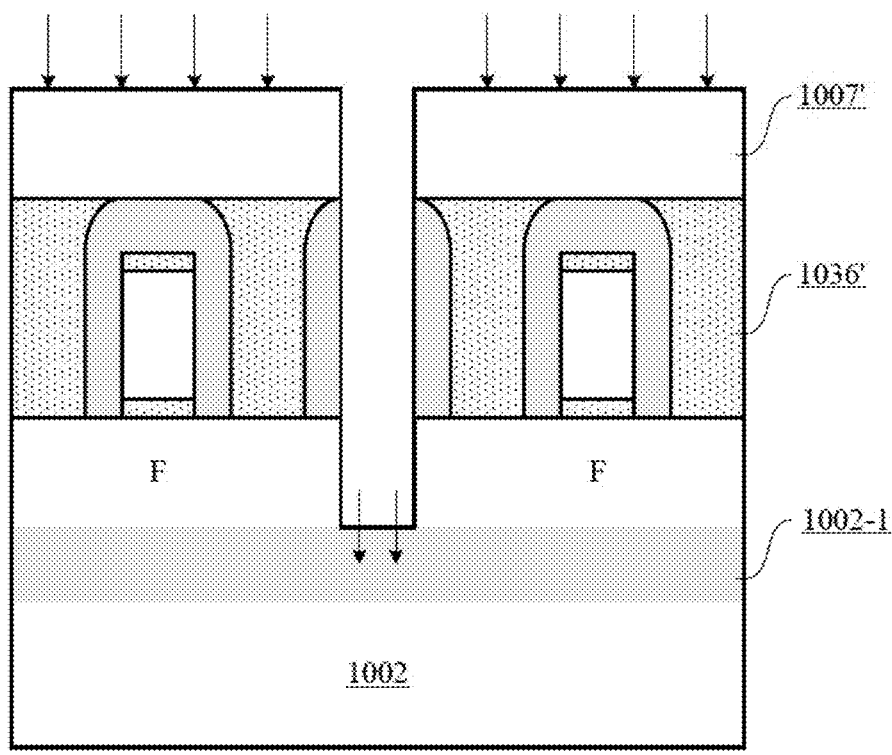
Figure 30B:
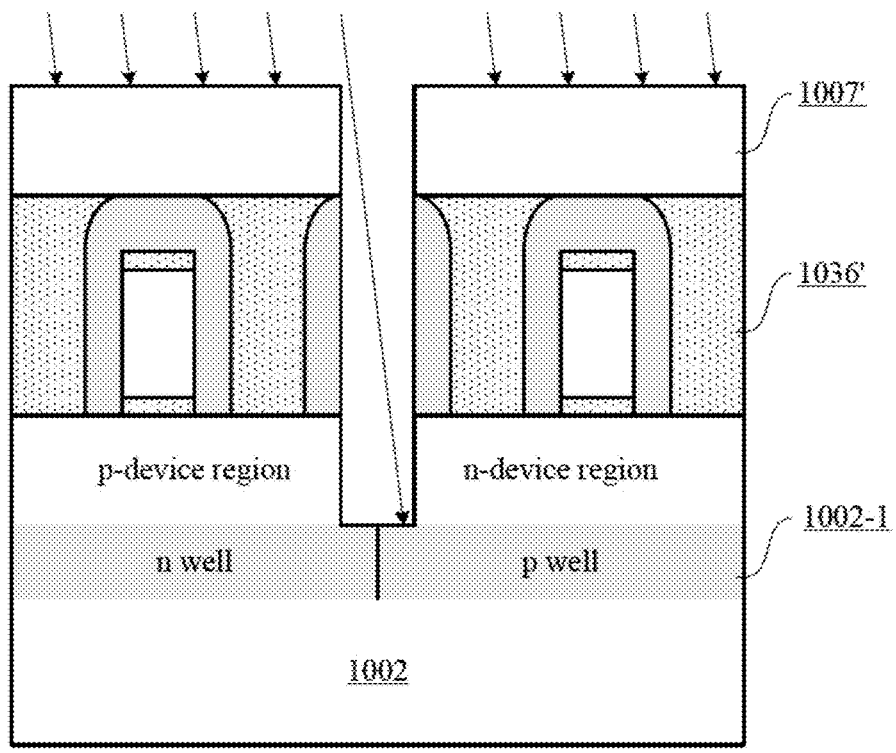
Figure 30C:
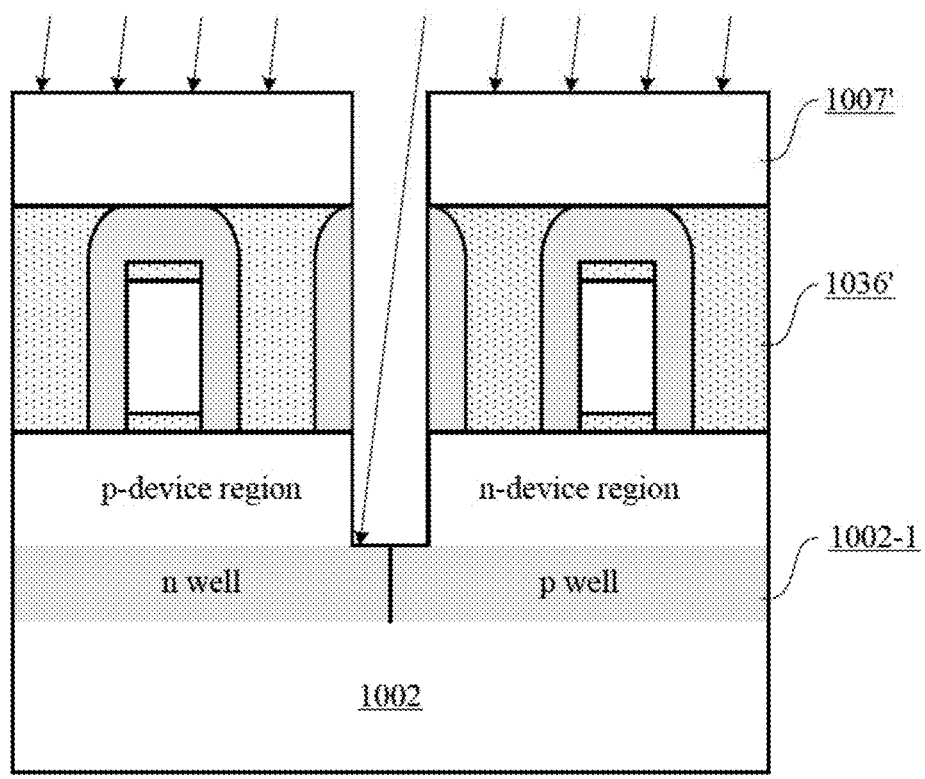

Then, an isolation section may be formed in the substrate through the opening. For example, implantation may be performed as shown by arrows in FIG. 30(*a*). Likewise, the implantation may be conducted vertically, and implanted dopants may have the same conductivity type as or a different conductivity type from that of the well region 1002-1, as described above with reference to FIGS. 3(*a*), 3(*b*), and 3(*c*). Alternatively, angular ion implantation may be conducted, as shown in 30(*b*) and 30(*c*), as described above with reference to FIGS. 3(*b'*) and 3(*b"*). As shown in FIG. 30(*a*), for those regions covered by the mask layer 1007', there can be very little or even no the implanted species; while for the region at the bottom of the opening, there can be the implanted species. Then, the mask layer 1007' may be removed.

Figure 31A:
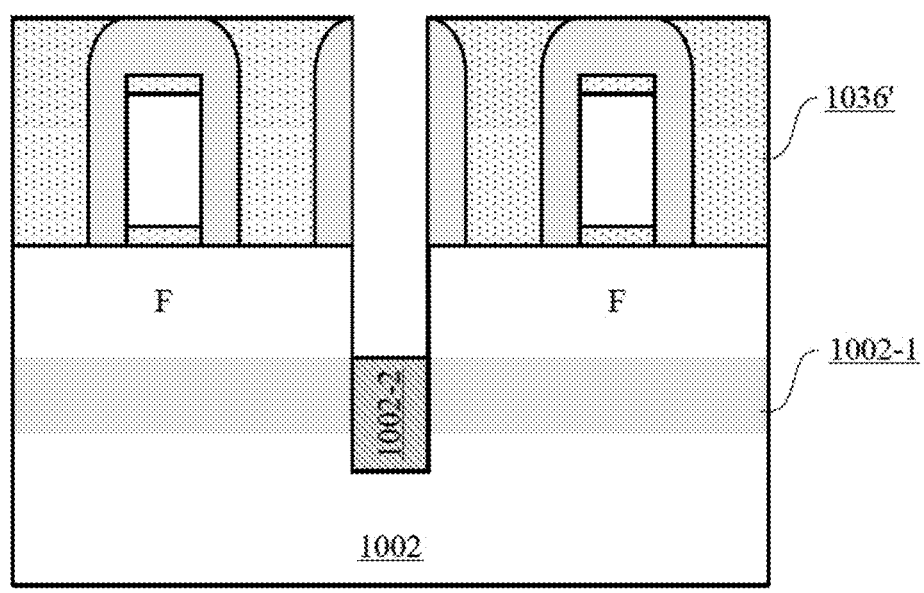
Figure 31B:
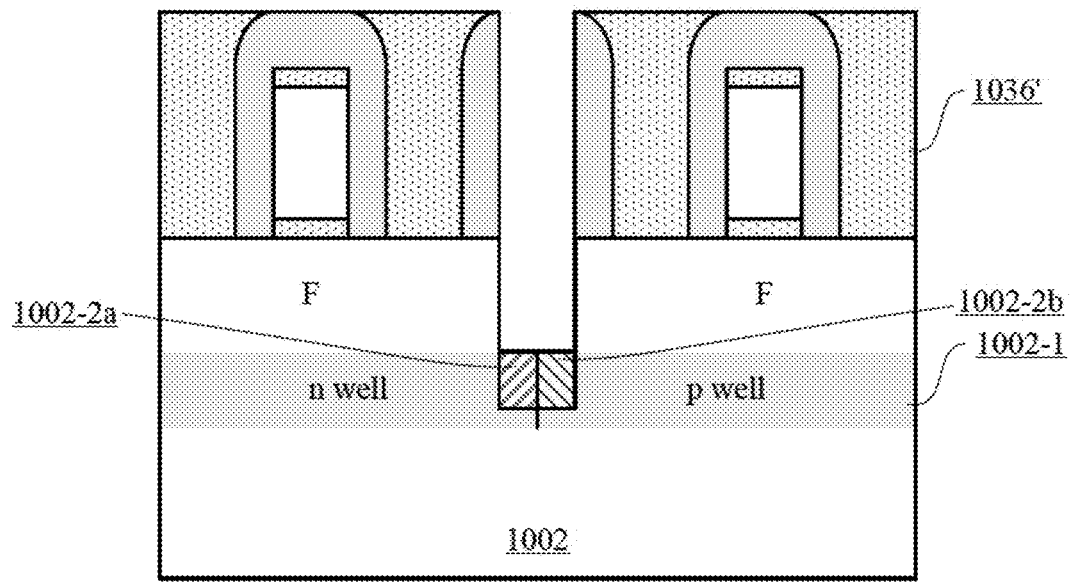
Figure 31B:
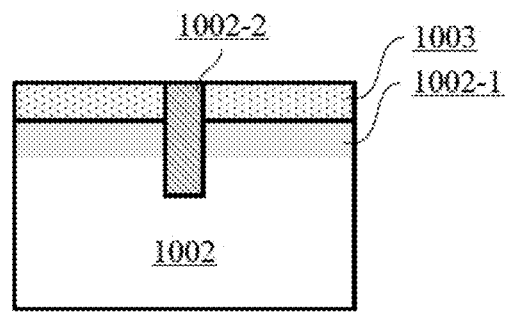

Likewise, annealing may be formed to form the isolation section 1002-2, as shown in FIGS. 31(*a*) and 31(*b*). Alternatively, as shown in FIG. 31(*a'*), in the case where both an N-type device and a P-type device are formed and angular implantation is performed as described above, an n-type doped region 1002-2*a*, with an n-type dopant concentration higher than that in the n-type well, may be formed in the P-type device region, and/or a p-type doped region 1002-2b, with a p-type dopant concentration higher than that in the p-type well, may be formed in the N-type device region.

Figure 32:
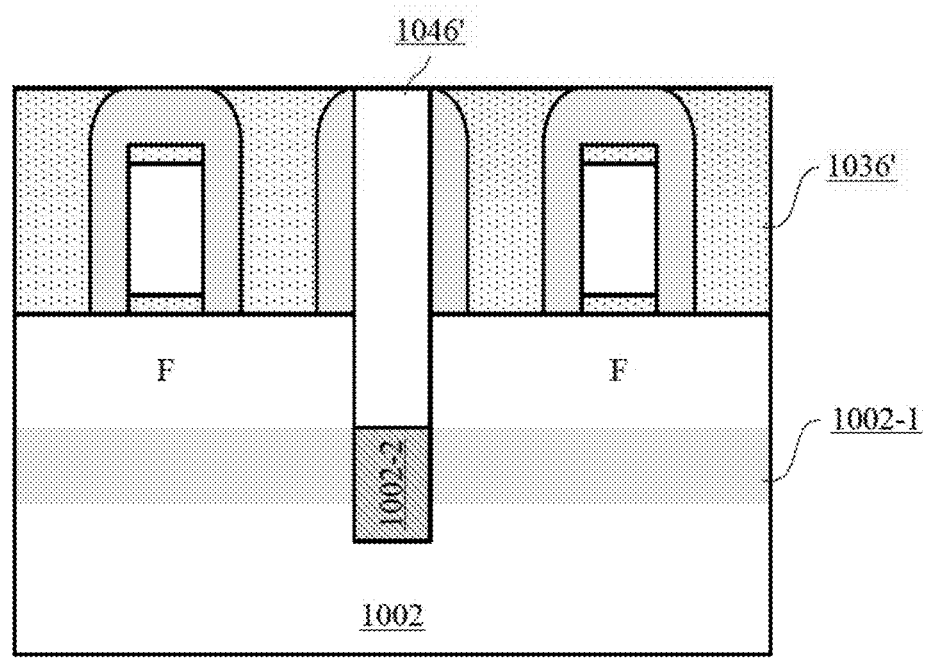

Further, the opening may be filled with dielectric to form a further isolation section 1046', as shown in FIG. 32. This can be done by, for example, depositing oxynitride, and then planarizing (for example, CMP) the deposited oxynitride. The CMP can stop on the nitride 1020.

Also, the epitaxial source/drain technology can be applied here.

Figure 33:
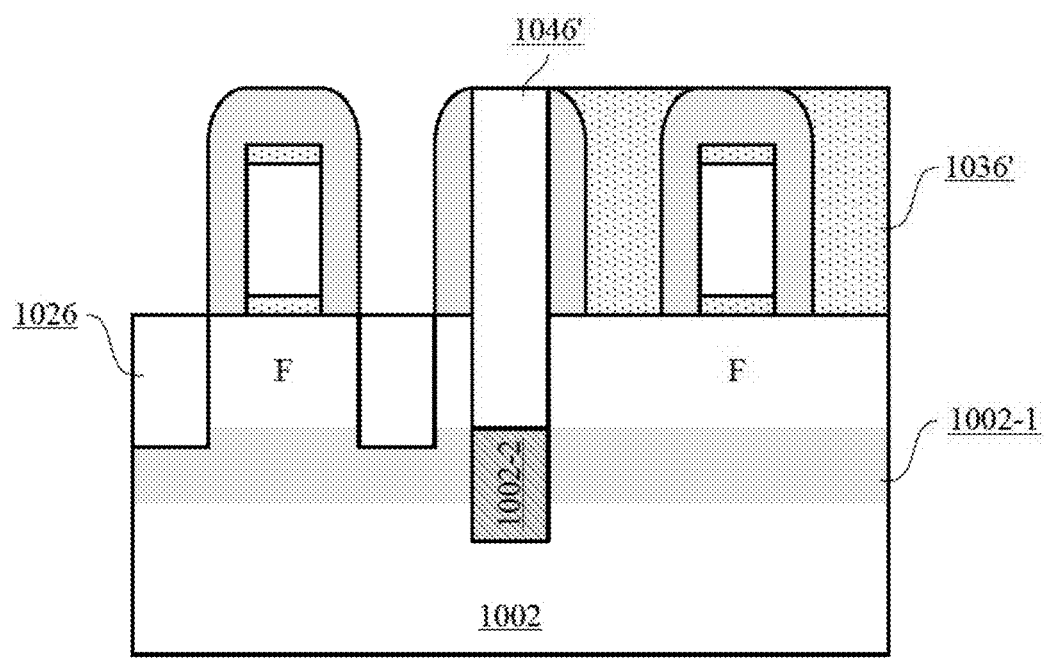

For example, as shown in FIG. 33, the interlayer dielectric layer 1036' may be removed from the region for the P-type device by, for example, covering the region for the N-type device by, for example, photoresist, selectively etching the interlayer dielectric layer 1036', and then removing the photoresist. Then, a further semiconductor layer 1026 which is at least partially embedded into the fin F may be formed on opposite sides of the gate structure. Reference may be made to the above descriptions with reference to FIG. 10.

Figure 34:
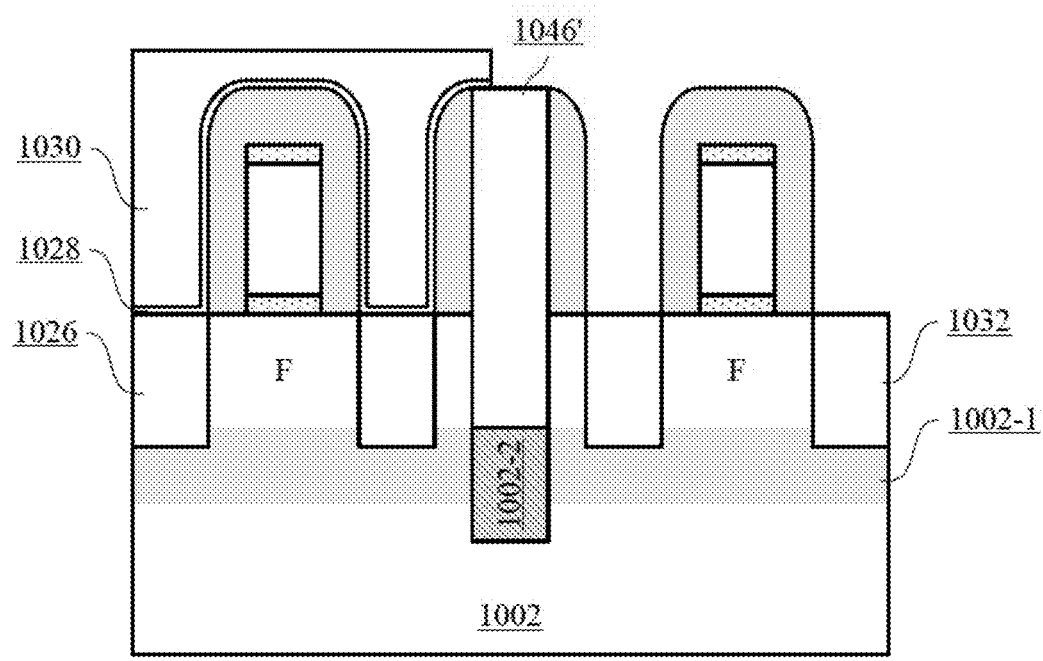

Likewise, a further semiconductor layer 1032 may be formed for the N-type device, as shown in FIG. 34. Specifically, a mask layer (1028/1030) may be formed to cover the region for the P-type device. Then, the interlayer dielectric layer 1036' may be removed, to expose the region for the N-type device. In the exposed region for the N-type device, a further semiconductor layer 1032 which is at least partially embedded into the fin F may also be formed on opposite sides of the gate structure of the N-type device. Reference may be made to the above descriptions with reference to FIGS. 11 and 12.

After that, a gate replacement process may be performed.

Figure 35:
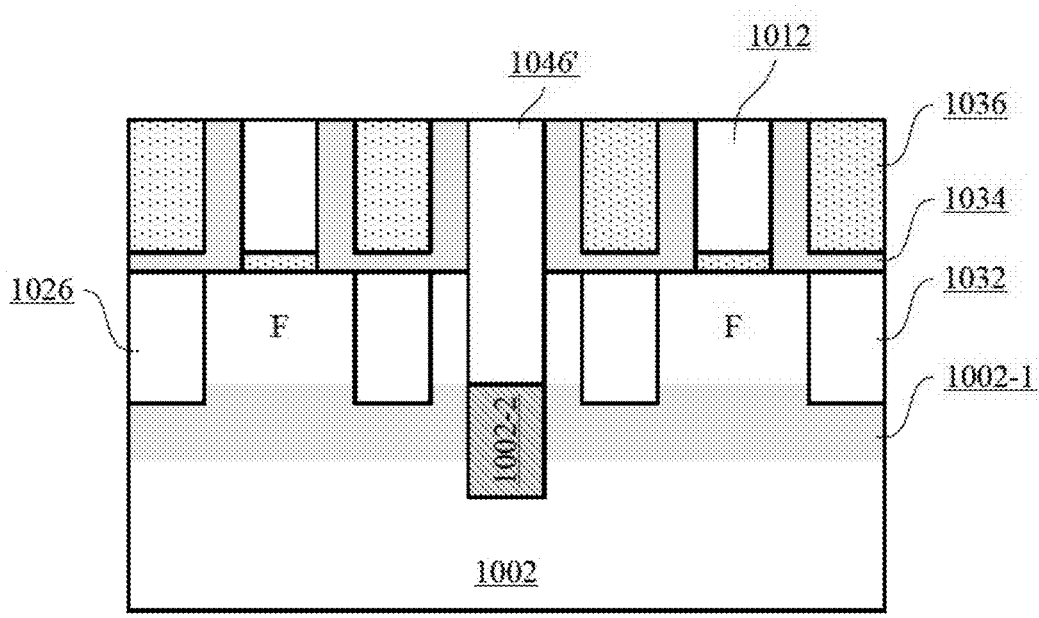
Figure 36:
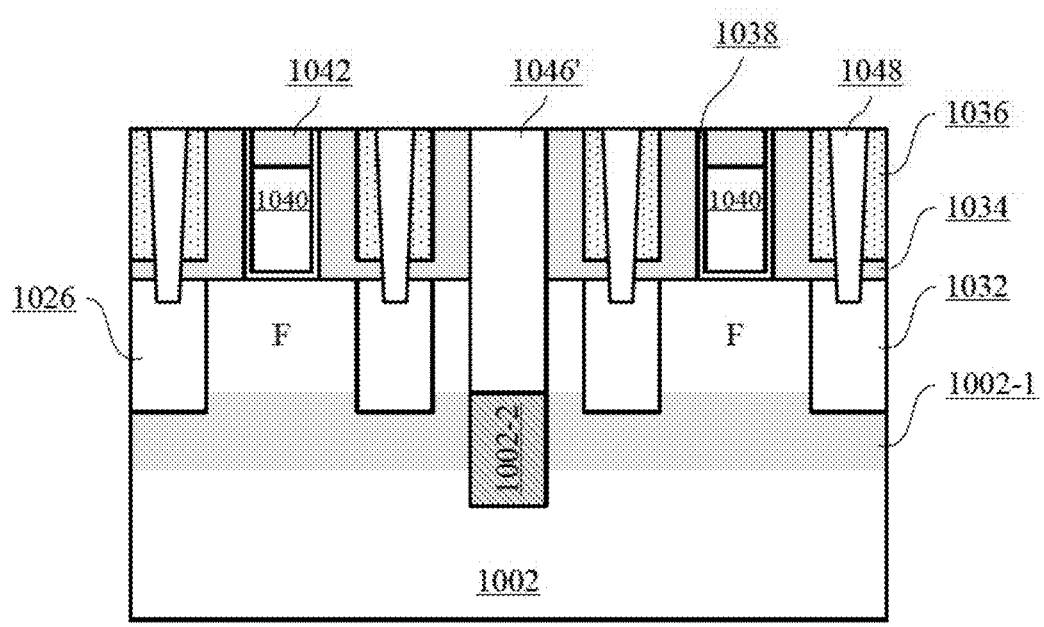

For example, as shown in FIG. 35, an interlayer dielectric layer 1036 may be formed on the substrate. Then, a planarization process, such as, CMP, may be performed until the sacrificial gate structures are exposed. Then, as shown in FIG. 36 exposed sacrificial gate structures then may be replaced by replacement gate structures. Reference may be made to the above descriptions with reference to FIGS. 14-17. Further, a source/drain contact 1048 may be formed. Reference may be made to the above descriptions with reference to FIG. 21.

Figure 37:
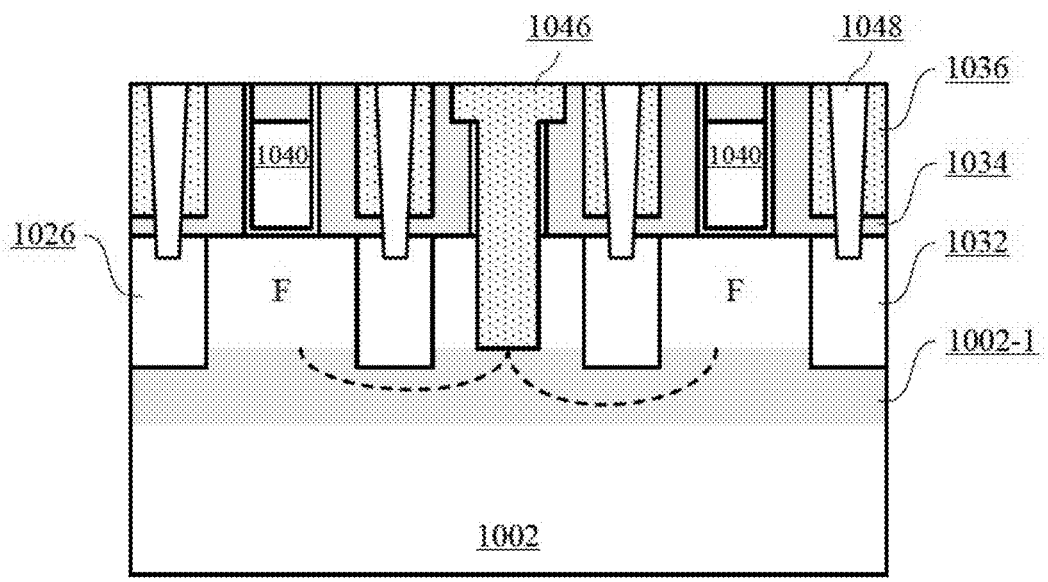
FIG. 37 illustrates possible leakage in the conventional art.

FIG. 37 illustrates possible leakage in the conventional art. As shown in FIG. 37, if without the isolation section 1002-2, depletion regions of the adjacent devices, indicated by the dashed lines, may become close to each other or even merge with each other. As a result, leakage current may increase.

Figure 38:
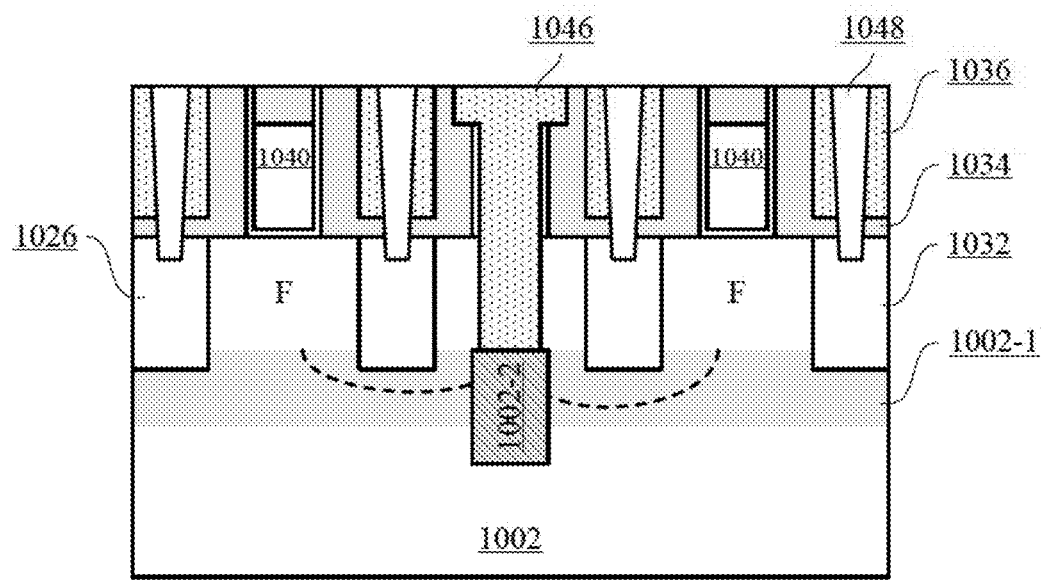
FIGS. 38 and 39 illustrates suppress of leakage according to embodiments of the present disclosure.
Figure 39:
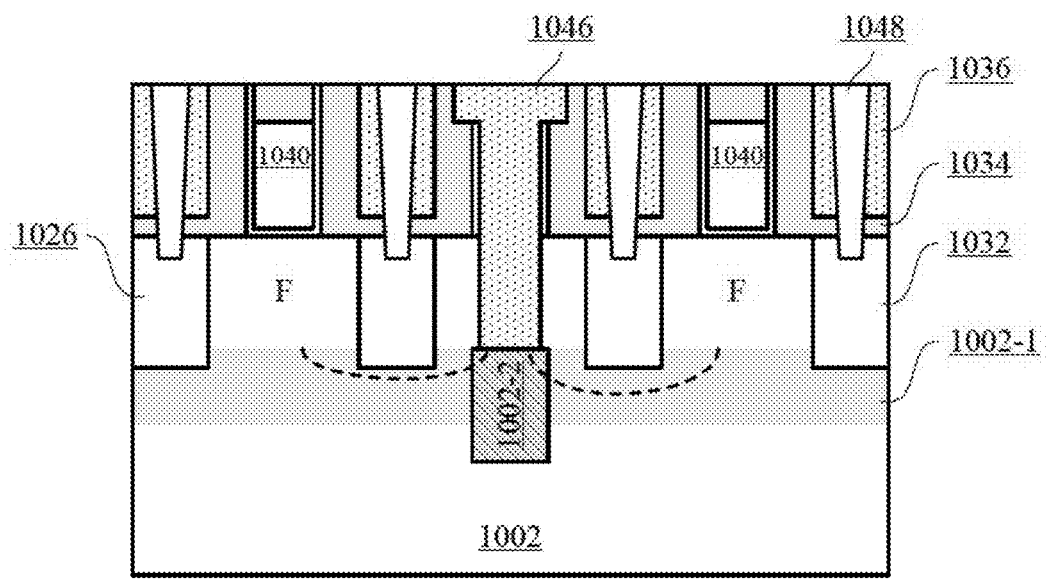

FIGS. 38 and 39 illustrates suppress of leakage according to embodiments of the present disclosure.

As shown in FIG. 38, the isolation section 1002-2 (for example, the insulation layer or the pn junction isolation) can prevent the depletion regions from merging.

As shown in FIG. 39, the isolation section 1002-2, with the higher concentration than the well region 1002-1, the depletion depth can be reduced, and thus merging between the depletion regions can be suppressed.

Although the gate-last process is illustrated in the above embodiments, the present disclosure is not limited thereto. The technology in the present disclosure is also applicable to the gate-first process.

Additional embodiments of the present disclosure include an electronic device comprising an Integrated Circuit (IC) comprising any of the semiconductor arrangements described above and in the figures. In one such embodiment, the electronic device further comprises a display operatively coupled to the IC and a wireless transceiver operatively coupled to the IC. In another embodiment, the electronic device further comprises a smart phone, a computer, a tablet computer, an artificial intelligence, a wearable smart device, or a mobile power supply.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

I claim:

1. A semiconductor arrangement, comprising:
 a bulk semiconductor substrate;
 a fin formed on the substrate;
 a first FinFET and a second FinFET formed on the substrate, wherein the first FinFET comprises a first gate stack intersecting the fin and a first gate spacer disposed on sidewalls of the first gate stack, the second FinFET comprises a second gate stack intersecting the fin and a second gate spacer disposed on sidewalls of the second gate stack;
 a dummy gate spacer formed between the first FinFET and the second FinFET and intersecting the fin, the dummy gate spacer having opposite inner sidewalls co-planar with respective sidewalls of the fin, or the dummy gate spacer having opposite inner sidewalls, each of the opposite inner sidewalls being laterally and substantially equally offset from a sidewall of the fin;
 a first isolation section self-aligned to a space defined by the dummy gate spacer, wherein the first isolation section electrically isolates the first FinFET from the second FinFET; and
 a second isolation section disposed under a bottom surface of the first isolation section, wherein the second isolation section has a height in a vertical direction greater than a distance between a sidewall of the first isolation section and a sidewall of the fin facing the sidewall of the first isolation section in a lateral direction, and a top-most portion of the second isolation section lies at a level lower than a top-most portion of the first isolation section.

2. The semiconductor arrangement of claim 1, wherein the substrate comprises a doped well, and the second isolation section is disposed at least partially in the doped well and defined between the first FinFET and the second FinFET.

3. The semiconductor arrangement of claim 1, wherein the substrate comprises a doped well, and the second isolation section has a dopant concentration higher than that in the doped well and is defined between the first FinFET and the second FinFET.

4. The semiconductor arrangement of claim 1, wherein the first FinFET is an n-type MOSFET and the second FinFET is a p-type MOSFET, the substrate comprises an n-type doped well under the second FinFET and a p-type doped well under the the first FinFET, and the second isolation section is defined between the first FinFET and the second FinFET and comprises at least a portion having an n-type dopant concentration higher than that in the n-type doped well and/or at least a portion having a p-type dopant concentration higher than that in the p-type doped well.

5. The semiconductor arrangement of claim 1, wherein the second isolation section comprises at least one of an insulation layer, a pn junction isolation, or a doped semiconductor isolation.

6. The semiconductor arrangement of claim 1, wherein the first isolation section comprises a dielectric material layer whose sidewalls extend substantially along inner walls of the dummy gate spacer.

7. The semiconductor arrangement of claim 1, wherein the second isolation section is substantially aligned to the first isolation section.

8. The semiconductor arrangement of claim 1, wherein the first gate stack and the second gate stack are recessed with respect to the first gate spacer and the second gate spacer, respectively, and the semiconductor arrangement further comprises dielectric layers disposed on top of the first gate stack and the second gate stack inside the first gate spacer and the second gate spacer, respectively.

9. The semiconductor arrangement of claim 1, further comprising a further semiconductor layer which is at least partially embedded into the fin on respective opposite sides of the first gate stack and/or the second gate stack, wherein the first FinFET and/or the second FinFET comprise respective source/drain regions at least partially formed in the further semiconductor layer.

10. The semiconductor arrangement of claim 1, wherein a sidewall of the second isolation section facing the first FinFET is closer to the first FinFET than a sidewall of the first isolation section facing the first FinFET, and a sidewall of the second isolation section facing the second FinFET is closer to the second FinFET than a sidewall of the first isolation section facing the second FinFET.

11. The semiconductor arrangement of claim 1, wherein the second isolation layer has a width greater than or smaller than a gate length of the gate stack.

12. An electronic device comprising an Integrated Circuit (IC) comprising the semiconductor device according to claim 1.

13. The electronic device of claim 12, further comprising a display operatively coupled to the IC and a wireless transceiver operatively coupled to the IC.

14. The electronic device of claim 12, wherein the electronic device comprises a smart phone, a computer, a tablet computer, an artificial intelligence, a wearable smart device, or a mobile power supply.

* * * * *